US012591029B2

(12) United States Patent
Neufeld et al.

(10) Patent No.: US 12,591,029 B2
(45) Date of Patent: Mar. 31, 2026

(54) THERMALLY ISOLATING CABLING ASSEMBLIES, SYSTEMS USING THERMALLY ISOLATING CABLING ASSEMBLIES, AND METHODS OF FABRICATING THERMALLY ISOLATING CABLING ASSEMBLIES

(71) Applicant: D-WAVE SYSTEMS INC., Burnaby (CA)

(72) Inventors: Richard D. Neufeld, Burnaby (CA); Surjit Singh Dhesi, Richmond (CA); Oscar Yui-kit Fung, Richmond (CA)

(73) Assignee: D-WAVE SYSTEMS INC., Burnaby (CA)

(*) Notice: Subject to any disclaimer, the term of this patent is extended or adjusted under 35 U.S.C. 154(b) by 236 days.

(21) Appl. No.: 18/104,489

(22) Filed: Feb. 1, 2023

(65) Prior Publication Data

US 2024/0019514 A1      Jan. 18, 2024

Related U.S. Application Data

(60) Provisional application No. 63/317,192, filed on Mar. 7, 2022.

(51) Int. Cl.
  *G01R 33/421*      (2006.01)
  *G01R 33/035*      (2006.01)
  *H01F 6/04*      (2006.01)
(52) U.S. Cl.
  CPC ....... *G01R 33/421* (2013.01); *G01R 33/0358* (2013.01); *H01F 6/04* (2013.01)
(58) Field of Classification Search
  CPC . H01B 7/18; H01B 7/34; H01B 12/00; G01R 33/421; G01R 33/0358; H01R 4/72;
  (Continued)

(56) References Cited

U.S. PATENT DOCUMENTS 2,937,228 A * 5/1960 Robinson ............. H02G 15/085
                                                          174/93
3,200,368 A     8/1965 Stekly et al.
(Continued)

FOREIGN PATENT DOCUMENTS

EP          0562708 A1      9/1993
EP          0424835 B1      8/1996
(Continued)

OTHER PUBLICATIONS

Altarev et al, "A magnetically shielded room with ultra low residual field and gradient," Review of Scientific Instruments 85, 075106 (2014).

(Continued)

*Primary Examiner* — William H. Mayo, III
(74) *Attorney, Agent, or Firm* — Cozen O'Connor

(57)          ABSTRACT

Cable assemblies and, systems using the assemblies can include thermal breaks between assembly sections, and methods for fabricating the assemblies can include creating thermal breaks. A cable assembly includes a first shielding cable having a first solderable material interleaved with a section of a second shielding cable having an exterior material that is a second solderable material and an inner material that is superconductive at and below a critical temperature. The cable assembly may be fabricated during the assembly of an apparatus, and, following assembly of the apparatus, a segment of the second shielding cable is etched to expose a portion of the inner material. Following fabrication of the cable assemblies, the apparatus may be installed in a cryogenic environment in which the exposed portion of superconductive inner material thermally isolates the cabling assembly proximate to a superconducting circuit from the remaining cabling assembly.

9 Claims, 8 Drawing Sheets

(58) Field of Classification Search
CPC .......... H01R 9/05; H01R 9/0503; H02G 1/16;
H02G 15/1806
USPC ... 174/125.1, 125.2, 25 C, 84 R, 84 C, 94 R;
427/117, 118; 29/599, 863, 869, 872,
29/873; 505/925, 926, 927
See application file for complete search history.

(56)                     References Cited

U.S. PATENT DOCUMENTS

| | | | |
|---|---|---|---|
| 3,297,819 A * | 1/1967 | Judson .................... | F16L 47/22 |
| | | | 156/48 |
| 3,582,851 A | 6/1971 | Meservey | |
| 3,644,987 A | 2/1972 | Scheffler et al. | |
| 3,667,033 A | 5/1972 | Davis | |
| 3,720,847 A | 3/1973 | Massar | |
| 3,807,041 A | 4/1974 | Mc | |
| 4,144,404 A * | 3/1979 | De Groef .............. | H01R 4/723 |
| | | | 333/260 |
| 4,409,579 A | 10/1983 | Clem | |
| 4,485,266 A * | 11/1984 | Minati ................... | H02G 15/34 |
| | | | 174/15.6 |
| 4,646,045 A | 2/1987 | Chari et al. | |
| 4,649,349 A | 3/1987 | Chiron et al. | |
| 4,755,755 A | 7/1988 | Carlson | |
| 4,879,807 A * | 11/1989 | Roucaute ................ | H01R 4/72 |
| | | | 174/88 C |
| 4,942,379 A | 7/1990 | Ogawa et al. | |
| 4,963,789 A | 10/1990 | Buhler | |
| 5,066,891 A | 11/1991 | Harrold et al. | |
| 5,111,574 A * | 5/1992 | Smathers .............. | H10N 60/80 |
| | | | 29/599 |
| 5,173,660 A | 12/1992 | Marsden | |
| 5,215,242 A | 6/1993 | Kosky et al. | |
| 5,280,241 A | 1/1994 | Ueda et al. | |
| 5,373,275 A | 12/1994 | Itoh et al. | |
| 5,466,885 A | 11/1995 | Irisawa | |
| 5,583,319 A * | 12/1996 | Lieurance ............... | H01R 4/68 |
| | | | 505/925 |
| 5,660,917 A | 8/1997 | Fujimori et al. | |
| 5,969,933 A | 10/1999 | Schultz et al. | |
| 6,069,430 A | 5/2000 | Tsunoda et al. | |
| 6,486,393 B1 | 11/2002 | Matsuba et al. | |
| 6,830,775 B1 | 12/2004 | Kawachi et al. | |
| 6,831,281 B2 | 12/2004 | Nakasuji | |
| 6,838,694 B2 | 1/2005 | Esteve et al. | |
| 6,853,185 B2 | 2/2005 | Tsukamoto et al. | |
| 7,335,909 B2 | 2/2008 | Amin et al. | |
| 7,533,068 B2 | 5/2009 | Maassen et al. | |
| 7,619,437 B2 | 11/2009 | Thom et al. | |
| 7,624,088 B2 | 11/2009 | Johnson et al. | |
| 7,687,938 B2 | 3/2010 | Bunyk et al. | |
| 7,990,662 B2 | 8/2011 | Berkley et al. | |
| 8,008,942 B2 | 8/2011 | Van et al. | |
| 8,008,991 B2 | 8/2011 | Tcaciuc et al. | |
| 8,159,313 B2 | 4/2012 | Uchaykin | |
| 8,190,548 B2 | 5/2012 | Choi | |
| 8,195,596 B2 | 6/2012 | Rose et al. | |
| 8,228,688 B2 | 7/2012 | Uchaykin et al. | |
| 8,247,799 B2 | 8/2012 | Bunyk et al. | |
| 8,279,022 B2 | 10/2012 | Thom et al. | |
| 8,346,325 B2 | 1/2013 | Thom et al. | |
| 8,354,592 B2 * | 1/2013 | Jang ........................ | H02G 15/34 |
| | | | 174/15.5 |
| 8,355,765 B2 | 1/2013 | Uchaykin et al. | |
| 8,421,053 B2 | 4/2013 | Bunyk et al. | |
| 8,441,329 B2 | 5/2013 | Thom et al. | |
| 8,441,330 B2 | 5/2013 | Uchaykin | |
| 8,745,850 B2 | 6/2014 | Farinelli et al. | |
| 8,854,704 B2 | 10/2014 | Takahashi | |
| 9,192,085 B2 | 11/2015 | Chavez | |
| 9,231,181 B2 | 1/2016 | Thom et al. | |
| 9,465,401 B2 | 10/2016 | Uchaykin | |
| 9,537,230 B2 * | 1/2017 | Pope .................. | H02G 15/1806 |
| 9,913,414 B2 | 3/2018 | Sadleir | |

| | | | |
|---|---|---|---|
| 10,003,217 B2 | 6/2018 | Kuerschner et al. | |
| 10,755,190 B2 | 8/2020 | Tcaciuc et al. | |
| 11,064,637 B2 | 7/2021 | Sterling et al. | |
| 11,449,784 B2 | 9/2022 | Sterling | |
| 2003/0218872 A1 | 11/2003 | Tsukada et al. | |
| 2004/0211586 A1 * | 10/2004 | Sinha ...................... | H01F 6/065 |
| | | | 174/125.1 |
| 2004/0232912 A1 | 11/2004 | Tsukamoto et al. | |
| 2004/0234680 A1 | 11/2004 | Kawachi et al. | |
| 2005/0189130 A1 * | 9/2005 | Bertini ................... | H01B 7/285 |
| | | | 174/25 C |
| 2006/0068993 A1 | 3/2006 | Egan | |
| 2006/0147154 A1 | 7/2006 | Thom et al. | |
| 2006/0225165 A1 | 10/2006 | Maassen et al. | |
| 2008/0176750 A1 | 7/2008 | Rose et al. | |
| 2008/0238531 A1 | 10/2008 | Harris | |
| 2009/0008632 A1 | 1/2009 | Bunyk et al. | |
| 2009/0102580 A1 | 4/2009 | Uchaykin | |
| 2009/0121215 A1 | 5/2009 | Choi | |
| 2009/0122508 A1 | 5/2009 | Uchaykin et al. | |
| 2009/0168286 A1 | 7/2009 | Berkley et al. | |
| 2011/0022820 A1 | 1/2011 | Bunyk et al. | |
| 2011/0237442 A1 | 9/2011 | Uchaykin | |

FOREIGN PATENT DOCUMENTS

| | | |
|---|---|---|
| JP | 62-105487 | 5/1987 |
| JP | 4276594 B2 | 3/2009 |
| JP | 5114796 B2 | 10/2012 |
| KR | 19990046591 A | 7/1999 |
| KR | 20030038109 A | 5/2003 |
| WO | 9609654 A1 | 3/1996 |
| WO | 02091491 A1 | 11/2002 |
| WO | 2009099972 A2 | 8/2009 |
| WO | 2009120638 A2 | 10/2009 |
| WO | 2010042735 A2 | 4/2010 |
| WO | 2013190263 A1 | 12/2013 |
| WO | 2016183213 A1 | 11/2016 |

OTHER PUBLICATIONS

Blatter et al., "Design aspects of superconducting-phase quantum bits," Physical Review B 63: 174511-1-174511-9, 2001.
Coonrod et al., "High Frequency Circuit Materials With Increased Thermal Conductivity," High Frequency Electronics, Nov. 2010.
F. Pobell, "Matter and Methods at Low Temperatures", Springer-Verlag, 2nd Edition, 1996.
Farhi et al., "Quantum Adiabatic Evolution Algorithms versus Simulated Annealing," MIT-CTP #3228, arXiv:quant-ph/0201031 v1, pp. 1-16, Jan. 8, 2002.
Feynman, "Simulating Physics with Computers," International Journal of Theoretical Physics 21(6/7): 467-488, 1982.
Friedman et al., "Quantum superposition of distinct macroscopic states," Nature 406:43-46, Jul. 6, 2000.
Gangull et al., "Improved thermal conductivity for chemically functionalized exfoliated graphite/epoxy composites," CARBON 46 (2008) 806-817, Feb. 15, 2008.
Hidalgo-Tobon, "Theory of Gradient Coil Design Methods for Magnetic Resonance Imaging," Concepts in Magnetic Resonance Part A, vol. 36A(4) 223-242 (2010), Jun. 19, 2010.
Il'ichev et al., "Continuous Monitoring of Rabi Oscillations in a Josephson Flux Qubit," Physical Review Letters 91(9): 097906-1-097906-4, week ending Aug. 29, 2003.
International Search Report & Written Opinion—PCT/US2020/066164.
Jorgenson, "Using Magnetic Shielding Materials," Electrical Design News (EDN), 83, 3, 8, p. 136-137, 1963.
Kornack et al., "A low-noise Ferrite magnetic shield," ArXiv: 0703115v2, Jul. 26, 2007.
Lanting et al., "Geometrical dependence of the low-frequency noise in superconducting flux qubits", Physical Review B, 79, 060509, Jun. 5, 2009, 4 pages.
Makhlin et al., "Quantum-state engineering with Josephson-junction devices," Reviews of Modern Physics 73 (2):357-400, Apr. 2001.

(56)                  References Cited

OTHER PUBLICATIONS

Milliken et al. "50 Ω characteristic impedance low-pass metal powder filters," Review of Scientific Instruments 78 (2):024701, 2007, 5 pages.

Mooij et al., "Josephson Persistent-Current Qubit," Science 285:1036-1039, Aug. 13, 1999.

Mueller, et al., "Superconducing aluminum heat switch and plated presscontacts for use at ultralow temperatures", Rev. Sci. Instrukm., vol. 49, No. 4 Apr. 178, 5 pages.

Naaman et al., "On-Chip Josephson Junction Microwave Switch," Northrop Grumman Systems Corp., Baltimore, Maryland, USA, Dec. 7, 2015, 10 pages.

Nielsen et al., Quantum Computation and Quantum Information, Cambridge University Press, Cambridge, 2000, "7.8 Other implementation schemes," pp. 343-345.

Orlando et al., "Superconducting persistent-current qubit," Physical Review B 60(22):15398-15413, Dec. 1, 1999.

Sancaktar et al., "Electrically Conductive Epoxy Adhesives," Polymers 2011, 3, 427-466; doi:10.3390/polym3010427.

Schmidt, "Influence of the Kapitza resistance on the thermal conductivity of filled epoxies," Cryogenics, Jan. 1975.

Shapiro et al., "An Improved Thermal Conductivity Polyurethane Composite for a Space Borne 20KV Power Supply." IEEEAC paper #1433, Version 2, Updated Dec. 15, 2004, date retrieved Dec. 15, 2004.

Shor, "Introduction to Quantum Algorithms," AT&T Labs—Research, arXiv:quant-ph/0005003 v2, pp. 1-17, Jul. 6, 2001.

Tsangaris et al., "Interfacial relaxation phenomena in particulate composites of epoxy resin with copper or iron particles," Materials Chemistry and Physics 44 (1996) 245-250.

Uchaikin et al, "Method to produce an uniform magnetic field in a dilution refrigerator," J. Phys.: Conf. Ser. 400 052038, 2012.

Unknown, "Slow-Wave Structures", Microwaves101.com, Jan. 15, 2021—Available at least as early as Jul. 4, 2018.

Ventra, et al. "Thermal conductivity of the normal and superconducting Al/Si 1 % alloy", Nuclear Physics B (Proc. Suppl.) 618 ( 1998) 576-581.

Yusoff et al., "Effect Of Particle Dispersion On Thermal Conductivity Of Copper Powder Filled Epoxy Composites," International Conference on Advancements of Materials and Nanotechnology 2007.

Gubser, D. U, et al., "Shielding of longitudinal magnetic fields with thin, closely spaced, concentric cylinders of high permeability material", Rev. Sci. Instrum., vol. 50, No. 6, Jun. 1979, 7 pages.

Nagasawa , et al., "Development of advanced Nb process for SFQ circuits", Science Direct, Jun. 9, 2004, 8 pages.

Satoh , et al., "Fabrication process of planarized multi-layer Nb integrated circuits", IEEE, Jun. 13, 2005, 4 pages.

Satoh , et al., "Planarization of Josephson junctions for large-scale integrated Nb SFQ circuits by mechanical polishing", Science Direct, 1999, 4 pages.

Y, Yaschuk et al., "12 Magnetic Shielding", Optical Magnetometry, Cambridge: Cambridge University Press, May 2013, pp. 132-155.

Coax Co., LTD, "Superconducting Cables", www.coax.co.jp/en/spconductiong, 1 page.

Keycom, "Cryogenic (Super-Low temperature)/ Superconductive Cables, Components and Systems", https://keycom.co.jp/eproducts/upj/top.htm. 6 pages.

Ulbrich, "Ulbrich Lite Weigh CCA & SPCCA", Copper Clad Aluminum, 1 page.

Burt, et al. "Optimal Three-layer Cylindrical Magnetic Shield Sets for Scientific Applications", Review of Scientific Instruments, vol. 73, No. 7, Jul. 2002, 7 pages.

Crawford, et al., "A Study of Magnetic Shielding Performance of a Fermilab International Linear Collider Superconducting RF Cavity Cryomodule", Technical Div., SFR Development Dept., Sep. 2, 2014, 7 pages.

Less EMF inc, "Guidelines for Installing Magnetic Shielding", 2006, 3 pages.

Morton, "Magnetic Properties of materials", JJLM, Trinity 2012, 12 pages.

Naaman, O. et al., "On-Chip Josephson Junction Microwave Switch," arXiv:1512.01484v1 [cond-mat.supr-con] Dec. 4, 2015, 10 pages.

* cited by examiner

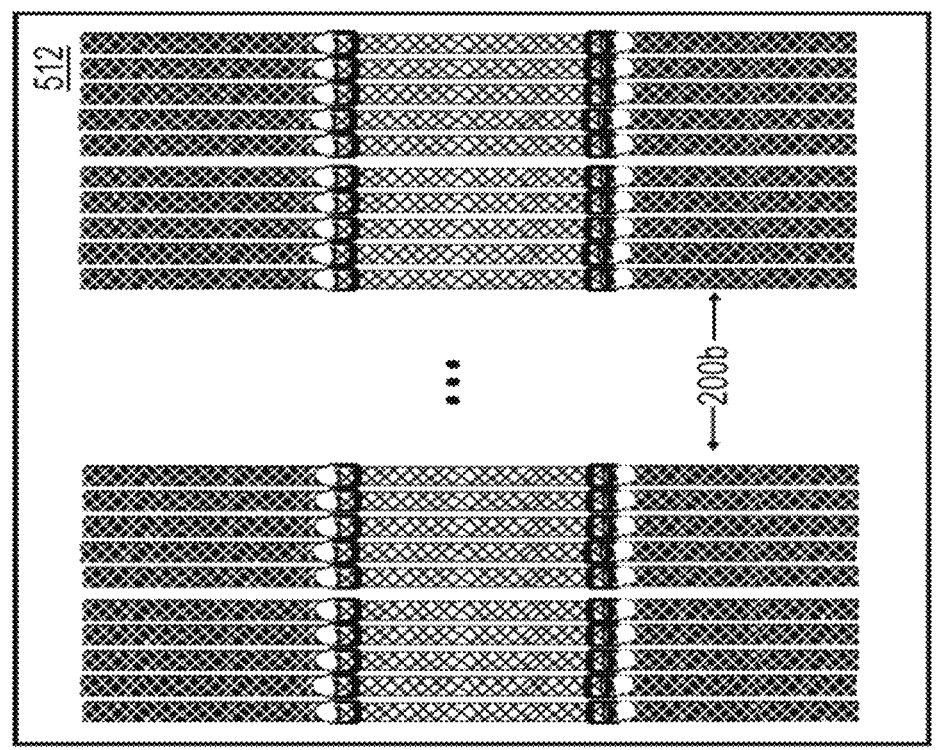
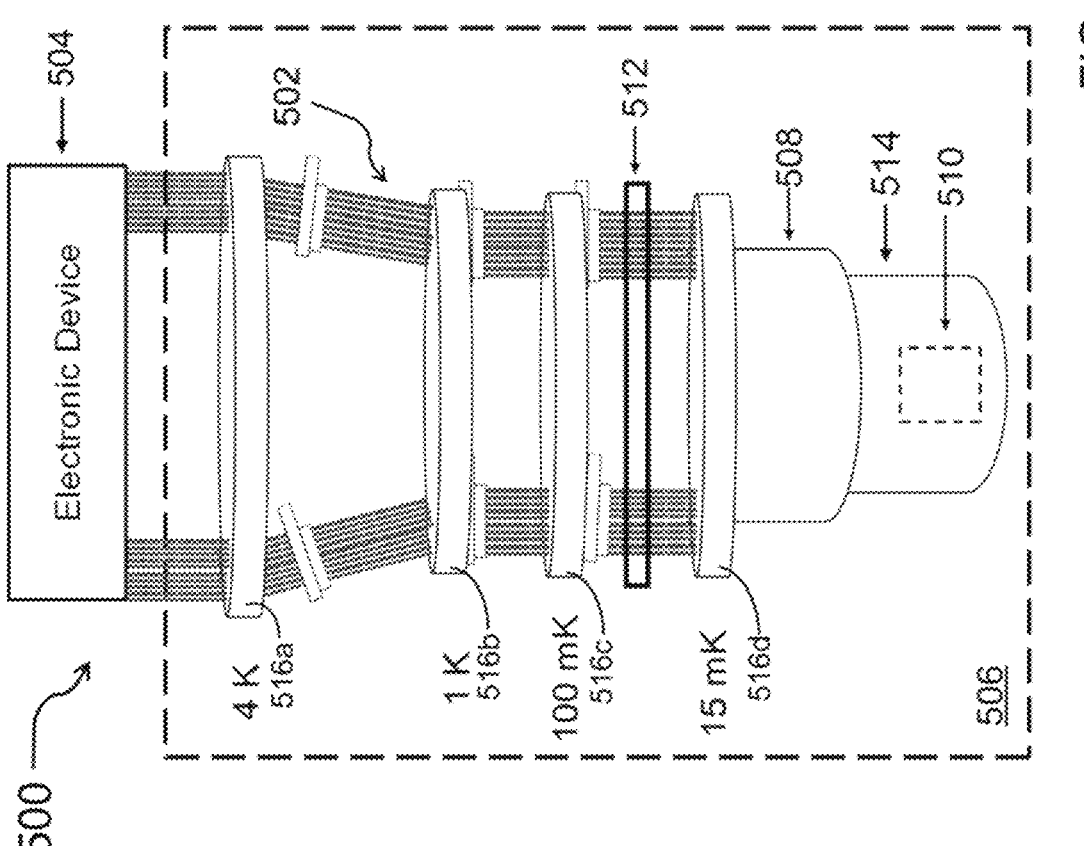
FIG. 5

600

Assemble an apparatus having at least one shielded signal cable assembly, including electrically connecting a first shielding cable to a second shielding cable and electrically connecting the second shielding cable to a third shielding cable
602

↓

Etch a portion of wires of the second shielding cable of each shielded signal cable assembly
604

700

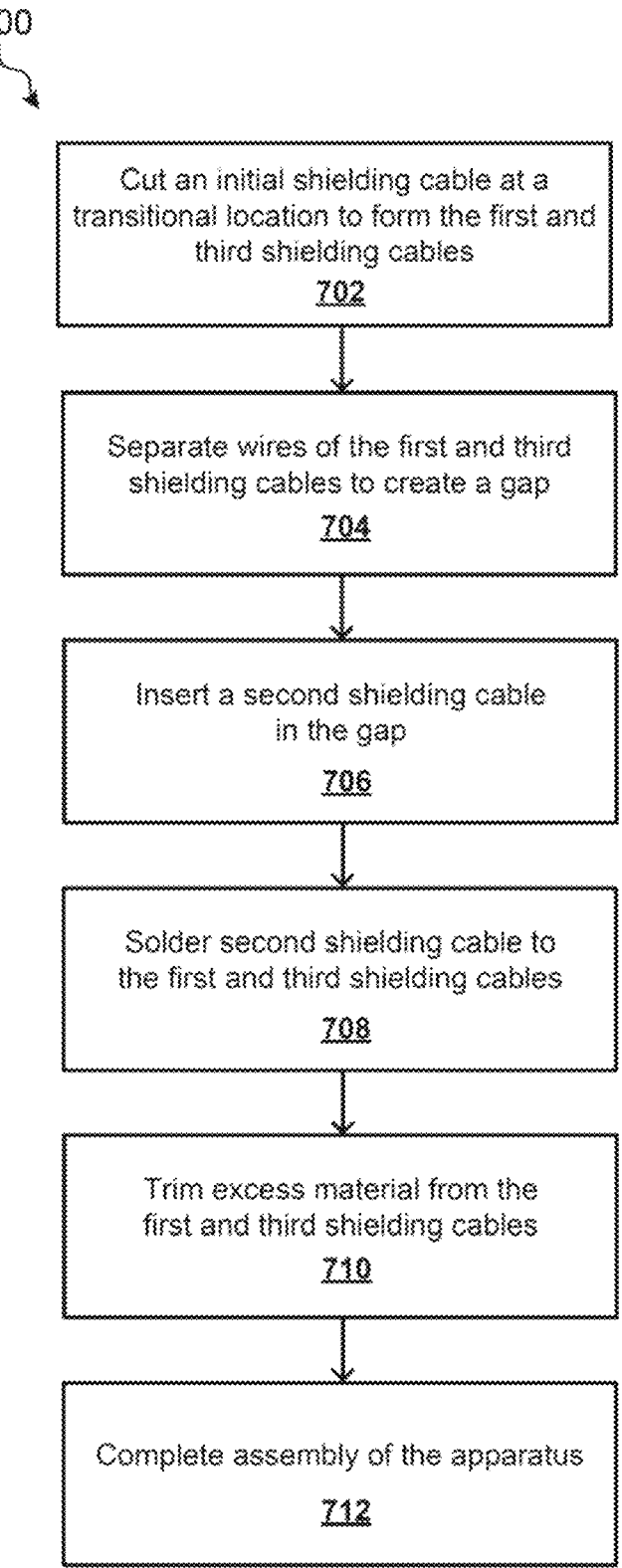

Cut an initial shielding cable at a
transitional location to form the first and
third shielding cables
702

Separate wires of the first and third
shielding cables to create a gap
704

Insert a second shielding cable
in the gap
706

Solder second shielding cable to
the first and third shielding cables
708

Trim excess material from the
first and third shielding cables
710

Complete assembly of the apparatus
712

Create at least one looped segment of
second shielding cables
802

Apply etchant to the portion of the wires
of the second shielding cables
804

Clean etchant and dry the
etched portion of the wires of the
second shielding cables
806

THERMALLY ISOLATING CABLING ASSEMBLIES, SYSTEMS USING THERMALLY ISOLATING CABLING ASSEMBLIES, AND METHODS OF FABRICATING THERMALLY ISOLATING CABLING ASSEMBLIES

FIELD

This disclosure generally relates to thermally isolating cabling and the fabrication thereof, and in particular, to fabricating thermally isolating cabling comprising materials that are superconducting in a low-temperature environment.

BACKGROUND

Quantum Devices

Quantum devices are structures in which quantum mechanical effects are observable. Quantum devices include circuits in which current transport is dominated by quantum mechanical effects. Such devices include spintronics and superconducting circuits. Both spin and superconductivity are quantum mechanical phenomena. Quantum devices can be used for measurement instruments, in computing machinery, and the like.

Quantum Computation

A quantum computer is a system that makes direct use of at least one quantum-mechanical phenomenon, such as, superposition, tunneling, and entanglement, to perform operations on data. The elements of a quantum computer are qubits. Quantum computers can provide speedup for certain classes of computational problems such as computational problems simulating quantum physics.

Superconducting Qubits

Superconducting qubits are solid state qubits based on circuits of superconducting materials. Operation of superconducting qubits is based on the underlying principles of magnetic flux quantization, and Josephson tunneling. Superconducting effects can be present in different configurations and can give rise to different types of superconducting qubits including flux, phase, charge, and hybrid qubits. The different configurations can vary in the topology of the loops, the placement of the Josephson junctions, and the physical parameters of elements of the superconducting circuits, such as inductance, capacitance, and Josephson junction critical current.

A superconducting material generally acts as a superconductor if it is cooled below a critical temperature that is characteristic of the specific material in question. For this reason, those of skill in the art will appreciate that a computer system that implements superconducting processors may implicitly include a refrigeration system for cooling the superconducting materials in the system. Further, a person of skill in the art will recognize that a material that is described as a superconducting material may be characterized as such even if it is warmer than the critical temperature and therefore not actively superconducting.

Quantum Processor

A quantum processor may take the form of a superconducting quantum processor. A superconducting quantum processor may include a number of superconducting qubits and associated local bias devices. A superconducting quantum processor may also include coupling devices (also known as couplers) that selectively provide communicative coupling between qubits.

In one implementation, the superconducting qubit includes a superconducting loop interrupted by a Josephson junction. The ratio of the inductance of the Josephson junction to the geometric inductance of the superconducting loop can be expressed as $2\pi L I_C/\Phi_0$ (where L is the geometric inductance, $I_C$ is the critical current of the Josephson junction, and $\Phi_0$ is the flux quantum). The inductance and the critical current can be selected, adjusted, or tuned, to increase the ratio of the inductance of the Josephson junction to the geometric inductance of the superconducting loop, and to cause the qubit to be operable as a bistable device. In some implementations, the ratio of the inductance of the Josephson junction to the geometric inductance of the superconducting loop of a qubit is approximately equal to three.

In one implementation, the superconducting coupler includes a superconducting loop interrupted by a Josephson junction. The inductance and the critical current can be selected, adjusted, or tuned, to decrease the ratio of the inductance of the Josephson junction to the geometric inductance of the superconducting loop, and to cause the coupler to be operable as a monostable device. In some implementations, the ratio of the inductance of the Josephson junction to the geometric inductance of the superconducting loop of a coupler is approximately equal to, or less than, one.

Further details and embodiments of example quantum processors that may be used in conjunction with the present systems and devices are described in, for example, U.S. Pat. Nos. 7,533,068; 8,008,942; 8,195,596; 8,190,548; and 8,421,053.

The foregoing examples of the related art and limitations related thereto are intended to be illustrative and not exclusive. Other limitations of the related art will become apparent to those of skill in the art upon a reading of the specification and a study of the drawings.

Hybrid Computing System Comprising a Quantum Processor

A hybrid computing system can include a digital computer communicatively coupled to an analog computer. In some implementations, the analog computer is a quantum computer and the digital computer is a classical computer.

The digital computer can include a digital processor that can be used to perform classical digital processing tasks described in the present systems and methods. The digital computer can include at least one system memory which can be used to store various sets of computer- or processor-readable instructions, application programs and/or data.

The quantum computer can include a quantum processor that includes programmable elements such as qubits, couplers, and other devices. The qubits can be read out via a readout system, and the results communicated to the digital computer. The qubits and the couplers can be controlled by a qubit control system and a coupler control system, respectively. In some implementations, the qubit and the coupler control systems can be used to implement quantum annealing on the analog computer.

Refrigeration

Temperature is a property that can have a significant impact on the state and evolution of a physical system. For instance, environments of extreme heat can cause even the strongest and most solid materials to melt away or disperse as gas. Likewise, a system that is cooled to cryogenic temperatures may enter into a regime, condition or state where physical properties and behavior differ substantially from what is observed at room temperature. In many technologies, it can be advantageous to operate in this cryogenic regime, condition or state and harness the resulting physical behaviors. One of those resulting physical behaviors is superconductivity, as discussed above.

Throughout this specification and the appended claims, the term "cryogenic" is used to refer to the temperature range of 0K to about 93K. A variety of technologies may be implemented to produce an environment with cryogenic temperature, though a commonly used device that is known in the art is the helium-3-helium-4 dilution refrigerator, known as a dilution refrigerator. Dilution refrigerators can be used to achieve cryogenic temperatures below 50 mK. In the operation of a typical dilution refrigerator, the apparatus may require a background temperature of about 4K. In order to provide this background cooling, the apparatus may be, for example, immersed in an evaporating bath of liquid helium-4 ($^4$He) or coupled to another type of refrigeration device, such as a pulse-tube cryocooler. The dilution refrigerator may comprise a series of heat exchangers and chambers that allow the temperature to be lowered to a temperature where a mixture of helium-3 ($^3$He) and $^4$He separates into two distinct phases. The first phase is primarily $^3$He, known as the concentrated phase, and the second phase is primarily $^4$He with some $^3$He, known as the dilute phase. The dilution refrigerator apparatus causes some of the $^3$He to move from the concentrated phase into the dilute phase in an endothermic process analogous to evaporation, providing cooling and allowing a temperature of around 10 mK to be achieved. The $^3$He is drawn out of the dilute phase mixture through a counter-flow heat exchanger, condensed, cooled, and returned to the concentrated phase portion of the mixture via the counter-flow heat exchanger to define a helium circuit. Even though the dilute phase is $^4$He rich, the $^3$He is preferentially drawn from the dilute phase because $^3$He has a higher partial pressure than $^4$He.

Etching

Etching removes layers of, for example, substrates, dielectric layers, oxide layers, electrically insulating layers and/or metal layers according to desired patterns delineated by photoresists or other masking techniques. Two example etching techniques are wet chemical etching and dry chemical etching.

Wet chemical etching or "wet etching" is typically accomplished by submerging a wafer or other component in a corrosive bath such as an acid bath. In general, etching solutions are housed in polypropylene, temperature-controlled baths. The baths are usually equipped with either a ring-type plenum exhaust ventilation or a slotted exhaust at the rear of the etch station. Vertical laminar-flow hoods are typically used to supply uniformly-filtered, particulate-free air to the top surface of the etch baths.

Dry chemical etching or "dry etching" is commonly employed due to its ability to better control the etching process and reduce contamination levels. Dry etching effectively etches desired layers through the use of gases, either by chemical reaction such as using a chemically reactive gas or through physical bombardment, such as plasma etching, using, for example, argon atoms.

Other types of etching that may be used on wafers, cables, or other similar surface may include plasma etching, physical etching with physical bombardment, and reactive ion etching.

BRIEF SUMMARY

Isolation of electrical signals transmitted to and from a superconducting circuit is necessary for precise operation of the superconducting circuit. In order to prevent the denigration of the signals and the superconducting circuit's operating environment, it is beneficial for the transmitted signals to be electromagnetically isolated from one another and for the device receiving the signal to be thermally isolated from the environment and thermally isolated from the assembly carrying the signal. Improving the cable assemblies used for the communication of signals between traditional computing devices and superconductive circuits may be advantageous in improved operation of a system.

A thermally isolating shielded cable assembly can provide a cable assembly that may reduce the amount of thermal energy that reaches a superconducting circuit. It can also provide a continuous electrical path along an entire length of a shielded cable assemble, and a non-continuous thermal path along the shielded cable assembly. A thermally isolating shielded cable assembly can include a strategically located thermal break site acting as an interruption in the thermal path and may limit the transmission of undesired thermal energy. The interruption can be provided by leveraging the properties of superconducting materials in cryogenic environments, and can include interleaving a first shielded cable assembly with a second shielded cable assembly, each including wires formed in part of easily-interfaceable materials. The wires of the second shielded cable assembly can be etched to provide a portion of an exposed superconducting material having a thermal conductivity lower than that of the easily-interfaceable materials.

According to an aspect of the invention, there is provided a method including assembling an apparatus having at least one shielded signal cable assembly. The assembling includes, for each shielded signal cable assembly: electrically connecting a first end of a first shielding cable to a first end of a second shielding cable at a first connection point, and electrically connecting a first end of a third shielding cable to a second end of the second shielding cable at a second connection point. The first shielding cable and the third shielding cable include first wires formed of a first solderable material and the second shielding cable includes second wires formed of an inner material surrounded by a second solderable material, wherein the inner material is a material that is superconducting at and below a critical temperature. Subsequent to the assembling the apparatus, the method also includes etching a portion of the second wires of each shielded signal cable assembly to remove the second solderable material and to expose the inner material.

In some implementations of the aspect, the etching can optionally include applying a chemical etchant solution to the portion of the second wires, where the portion includes a length of the second shielding cable located medially to the first connection point and the second connection point.

In some implementations of the aspect, the chemical etchant solution can optionally include a nitric acid solution.

In some implementations of the aspect, the assembling can optionally include, for each shielded signal cable assembly: cutting an initial shielding cable at a transitional location to create the first shielding cable having a first shielding cable cut end and the third shielding cable having a third shielding cable cut end, separating the first wires at the first and the third shielding cable cut ends to create a gap, and inserting the second shielding cable into the gap. The electrically connecting the first shielding cable to the second shielding cable can optionally include soldering the first wires of the first shielding cable cut end to the second wires at the first end of the second shielding cable at the first connection point, and the electrically connecting the third shielding cable to the second shielding cable can optionally include soldering the first wires of the third shielding cable cut end to the second wires at the second end of the second shielding cable at the second connection point.

In some implementations of the aspect, the assembling can optionally include, for at least one shielded signal cable assembly: cutting at least one of the first shielding cable and the third shielding cable in at least one additional transitional location to create respective upper shielding cable segments having upper shielding cable segment cut ends and lower shielding cable segments having lower shielding cable segment cut ends, separating the first wires of the upper and the lower shielding cable segment cut ends to create respective additional gaps, inserting one or more additional second shielding cables into respective additional gaps; soldering the first wires of each upper shielding cable segment cut end to the second wires at a first end of respective additional second shielding cables at one or more respective additional upper connection points; and soldering the first wires of each lower shielding cable segment cut end to the second wires at a second end of respective additional second shielding cables at one or more respective additional lower end connection points.

In some implementations of the aspect, subsequent to the etching the portion of the second wires of each shielded signal cable assembly, the method can optionally include installing the apparatus at least partially within a cryogenic environment and coupling at least one electronic device to a superconducting circuit. The installing can optionally include arranging the apparatus such that the first connection point is located in a region having a temperature within a temperature range at which a thermal conductivity value of an exposed inner material portion of the second wires is lower than a thermal conductivity value of the first solderable material of the first wires of the first and third shielding cables.

In some implementations of the aspect, the at least one electronic device can optionally be arranged at a room temperature location and the coupling the at least one electronic device to the superconducting circuit can optionally include, for each shielded signal cable assembly: electrically coupling the first shielding cable to a respective at least one electronic device, wherein the first shielding cable is arranged to transmit a signal from the room temperature location through the first connection point to the second shielding cable.

In some implementations of the aspect, the electrically connecting the first shielding cable to the second shielding cable and electrically connecting the third shielding cable to the second shielding cable can optionally establish an electrical path and a thermal path through the shielded signal cable assembly, and the etching the portion of the second wires can optionally interrupt the thermal path of the shielded signal cable assembly.

In another aspect of the invention, there is provided a shielded signal cable assembly including: a first shielding cable having first shielding cable wires formed of a first solderable material; a second shielding cable having second shielding cable wires formed of an inner material surrounded by a second solderable material, wherein the inner material is a material that is superconducting at and below a critical temperature; and a first connection point at which a first end of the first shielding cable and a first end of the second shielding cable are electrically connected. A length of the second shielding cable has an exposed inner material portion at which the second solderable material of the second shielding cable wires has been etched.

In some implementations of the aspect, a thermal conductivity value of the exposed inner material portion of the second shielding cable wires can optionally be lower than a thermal conductivity value of the first solderable material of the first shielding cable wires in a range of temperatures.

In some implementations of the aspect, the exposed inner material portion of the second shielding cable wires can optionally be operable as a heat switch when having a temperature within the range of temperatures.

In some implementations of the aspect, the shielded signal cable assembly can optionally include a second connection point formed by an electrical connection between a second end of the second shielding cable and a first end of a third shielding cable having third shielding cable wires formed of the first solderable material.

In some implementations of the aspect, the shielded signal cable assembly can optionally include one or more additional second shielding cables each having additional exposed inner material portions at which the second solderable material of additional second shielding cable wires has been etched; one or more third shielding cables; one or more respective first shielding cables; one or more respective first connection points, each formed by an electrical connection between a first end of each of the one or more additional second shielding cables and an end of a respective first shielding cable; and one or more respective second connection points, each formed by an electrical connection between a second end of each of the one or more additional second shielding cables and an end of a respective third shielding cable.

In some implementations of the aspect, the exposed inner material portion can optionally be located medially along the second shielding cable to each of the first connection point and the second connection point.

In some implementations of the aspect, the second solderable material of the second shielding cable can optionally be copper or silver-coated copper and the inner material can optionally be aluminum, and the critical temperature can optionally be 1.1K.

In some implementations of the aspect, the first solderable material and the second solderable material can optionally be either a same material as one another or different materials from one another.

In some implementations of the aspect, the first shielding cable and the second shielding cable can optionally each comprise a cable core surrounded by the first shielding wires and the second shielding wires, respectively. The first shielding wires and the second shielding wires can optionally shield the cable core from electromagnetic interference (EMI) and radio frequency interference (RFI), and the first shielding cable and the second shielding cable can optionally each be one of a coaxial cable or a twisted pair.

In a further aspect of the invention, there is provided a system including: a cryogenic refrigerator having a plurality of regions, each region having a different temperature; at least one electronic device located externally to the cryogenic refrigerator; a superconducting circuit located in a region of the cryogenic refrigerator having a lowest temperature; and an assembly having at least one shielded signal cable assembly of an aspect described herein. The assembly is arranged such that the at least one shielded signal cable assembly is communicatively coupled to the least one electronic device and the superconducting circuit.

In an implementation of the aspect, the first shielding cable of each shielded signal cable assembly can optionally be coupled to a respective at least one electronic device, the first connection point and the second shielding cable can optionally be located in a region of the cryogenic refrigerator having a temperature within a range at which a thermal conductivity value of the exposed inner material portion of the second shielding cable wires is lower than a thermal conductivity value of the first solderable material of the first shielding cable wires.

In an implementation of the aspect, the at least one shielded signal cable assembly can optionally provide: a continuous electrical path between the at least one electronic device and the superconducting circuit, and a thermal path having an interruption along the length of the second shielding cable at which the second shielding cable wires has been etched.

In an implementation of the aspect, the superconducting circuit can optionally be a quantum processor.

In an implementation of the aspect, each at least one electronic device can optionally be one of: a digital computing system, one or more digital processors, an input peripheral device, an output peripheral device, an analog processor, and a control system.

In other aspects, the features described above may be combined together in any reasonable combination as will be recognized by those skilled in the art.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

FIG. 5 illustrates a partial system including shielding cable assemblies for transmitting signals in a computing system, according to an implementation of the invention.

FIG. 7 is a flow chart diagram of an example method to assemble an apparatus as part of the construction of the shielded cable assembly of FIG. 6, according to an implementation of the invention.

DETAILED DESCRIPTION

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure, or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

Example Hybrid Computing System

Figure 1:
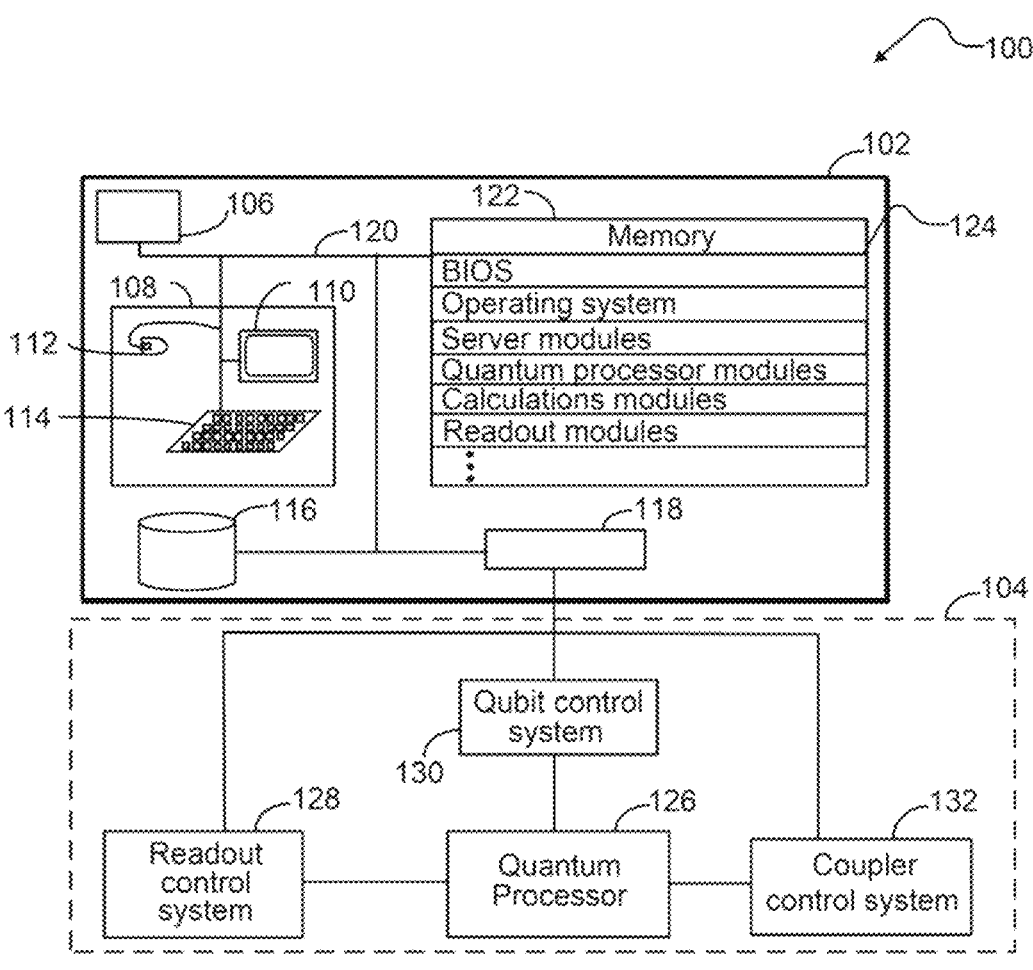
FIG. 1 is a schematic diagram of a hybrid computing system including a digital computer coupled to an analog computer, in accordance with the present systems, devices, and methods, according to an implementation of the invention.

FIG. 1 illustrates a computing system 100 comprising a digital computer 102. The example digital computer 102 includes one or more digital processors 106 that may be used to perform classical digital processing tasks. Digital computer 102 may further include at least one system memory 122, and at least one system bus 120 that couples various system components, including system memory 122 to digital processor(s) 106. System memory 122 may store one or more sets of processor-executable instructions, which may be referred to as modules 124.

The digital processor(s) 106 may be any logic processing unit or circuitry (for example, integrated circuits), such as one or more central processing units ("CPUs"), graphics processing units ("GPUs"), digital signal processors ("DSPs"), application-specific integrated circuits ("ASICs"), programmable gate arrays ("FPGAs"), programmable logic controllers ("PLCs"), etc., and/or combinations of the same.

In some implementations, computing system 100 comprises an analog computer 104, which may include one or more quantum processors 126. Quantum processor 126 may include at least one superconducting integrated circuit. Digital computer 102 may communicate with analog computer 104 via, for instance, a controller 118. Certain computations may be performed by analog computer 104 at the instruction of digital computer 102, as described in greater detail herein.

Digital computer 102 may include a user input/output subsystem 108. In some implementations, the user input/output subsystem includes one or more user input/output components such as a display 110, mouse 112, and/or keyboard 114.

System bus 120 may employ any known bus structures or architectures, including a memory bus with a memory controller, a peripheral bus, and a local bus. System memory 122 may include non-volatile memory, such as read-only memory ("ROM"), static random-access memory ("SRAM"), Flash NAND; and volatile memory such as random-access memory ("RAM") (not shown).

Digital computer 102 may also include other non-transitory computer- or processor-readable storage media or non-volatile memory 116. Non-volatile memory 116 may take a variety of forms, including: a hard disk drive for reading from and writing to a hard disk (for example, a magnetic disk), an optical disk drive for reading from and writing to removable optical disks, and/or a solid-state drive (SSD) for reading from and writing to solid state media (for example NAND-based Flash memory). Non-volatile memory 116 may communicate with digital processor(s) 106 via system bus 120 and may include appropriate interfaces or controllers 118 coupled to system bus 120. Non-volatile memory 116 may serve as long-term storage for processor- or computer-readable instructions, data structures, or other data (sometimes called program modules or modules 124) for digital computer 102.

Although digital computer 102 has been described as employing hard disks, optical disks and/or solid-state storage media, those skilled in the relevant art will appreciate that other types of nontransitory and non-volatile computer-readable media may be employed. Those skilled in the relevant art will appreciate that some computer architectures employ nontransitory volatile memory and nontransitory non-volatile memory. For example, data in volatile memory may be cached to non-volatile memory or a solid-state disk that employs integrated circuits to provide non-volatile memory.

Various processor- or computer-readable and/or executable instructions, data structures, or other data may be stored in system memory 122. For example, system memory 122 may store instructions for communicating with remote clients and scheduling use of resources including resources on the digital computer 102 and analog computer 104. Also, for example, system memory 122 may store at least one of processor executable instructions or data that, when executed by at least one processor, causes the at least one processor to execute the various algorithms to execute instructions. In some implementations system memory 122 may store processor- or computer-readable calculation instructions and/or data to perform pre-processing, co-processing, and post-processing to analog computer 104. System memory 122 may store a set of analog computer interface instructions to interact with analog computer 104.

Analog computer 104 may include at least one analog processor such as quantum processor 126. Analog computer 104 may be provided in an isolated environment, for example, in an isolated environment that shields the internal elements of the quantum computer from heat, magnetic field, and other external noise. The isolated environment may include a refrigerator, for instance a dilution refrigerator, operable to cryogenically cool the analog processor, for example to temperature below approximately 1 K.

Analog computer 104 may include programmable elements such as qubits, couplers, and other devices (also referred to herein as controllable devices). Qubits may be read out via readout system 128. Readout results may be sent to other computer- or processor-readable instructions of digital computer 102. Qubits may be controlled via a qubit control system 130. Qubit control system 130 may include on-chip Digital to Analog Converters (DACs) and analog lines that are operable to apply a bias to a target device. Couplers that couple qubits may be controlled via a coupler control system 132. Coupler control system 132 may include tuning elements such as on-chip DACs and analog lines. Qubit control system 130 and coupler control system 132 may be used to implement a quantum annealing schedule on analog processor 126. Programmable elements may be included in quantum processor 126 in the form of an integrated circuit. Qubits and couplers may be positioned in layers of the integrated circuit that comprise a first material. Other devices, such as readout control system 128, may be positioned in other layers of the integrated circuit that comprise a second material. In accordance with the present disclosure, a quantum processor, such as quantum processor 126, may be designed to perform quantum annealing and/or adiabatic quantum computation. Examples of quantum processors are described in U.S. Pat. No. 7,533,068.

Thermally Isolating Cable Assemblies for Use with a Superconducting Circuit

Cabling is an important component in electronic systems, as it electrically couples components of the electronic system to one another and transmits signals between them. However, cabling can also introduce unwanted energy to a system that might interfere with the quality of the transmitted signal. One prominent source of interference may be thermal noise arising from heat in the cabling assembly. In computing systems that include circuits requiring very precise measurements, it may be beneficial to reduce the interference to improve the quality of the measurements.

Electronic systems that are greatly impacted by heat and thermal noise may be operated at very low temperatures to mitigate these impacts. For instance, a system may include a computing device in communication with a superconducting circuit. As control signals typically must originate from room temperature, thermal energy may be conducted from room temperature through cabling that traverses different temperature regions of a cryogenic system. Thermal energy transmitted to the superconducting device may undesirably affect its operation due to material properties of the superconducting material. In an example, a superconducting circuit may be a quantum processor, which may be highly sensitive to thermal noise and kept in a cryogenic environment. Quantum processors may measure voltage representations of quantum energy states of its qubits. At extremely low temperatures, there is less vibrational energy present in the atom, and therefore desired quantum effects may be more easily measured. Thermal energy and noise may introduce thermal fluctuations into the quantum processor and may cause a quantum state of a qubit to be erroneously flipped. By reducing the thermal energy introduced to a quantum processor, one may reduce sources of error and obtain more precise solutions to problems solved by the quantum processor.

Signals transmitted between a computing device and a superconducting circuit can be electromagnetically isolated from one another to reduce interference. One technique that can be used to isolate signals includes the use of shielded cables to transmit the signals. Shielded cables may include a cable core that carries the signal itself (i.e., a signal line) that is surrounded by wires forming an RF braid such that electromagnetic interference from the environment and/or other cables may be reduced. The shielded cables may connect the computing components via standard soldering techniques. Solderable cabling is formed of highly conductive pure metals, which in applications such as those described above, may undesirably transmit heat to a superconducting circuit or a quantum processor located in a cryogenic environment. The heat load carried by solderable cabling may increase temperature and introduce thermal noise to the terminating component, which may make it more susceptible to error. Solderable cables may also be formed of metal alloys having a lower thermal conductivity than standard solderable metals; still, the reduction of the heat load by using these materials might not result in significant improvements.

Materials that superconduct at or below a critical temperature may be used as thermal barriers. For example, aluminum may be used as a heat switch at a temperature where it has a very low thermal conductivity value due to its superconductive properties. However, superconducting materials are rarely used for cabling purposes due to their material incompatibility in electrically coupling with standard interfaces. For example, aluminum cannot easily be soldered to standard interfacing materials, such as copper and silver, and may require coupling via ultrasonic bonding, which might not be a compatible connection method in many systems.

For a computing system that is at least partially located in a cryogenic environment, it may be advantageous to couple components using a cabling assembly having a continuous electrical path. It may also be advantageous to interrupt a thermal path of the cabling assembly to reduce an amount of heat travelling to a terminating end of the cabling assembly. To thermally isolate one portion of the system from another without disrupting transmission of a signal, a shielded signal cable assembly that is a composite of two cables having different material properties can be fabricated.

Figure 2A:
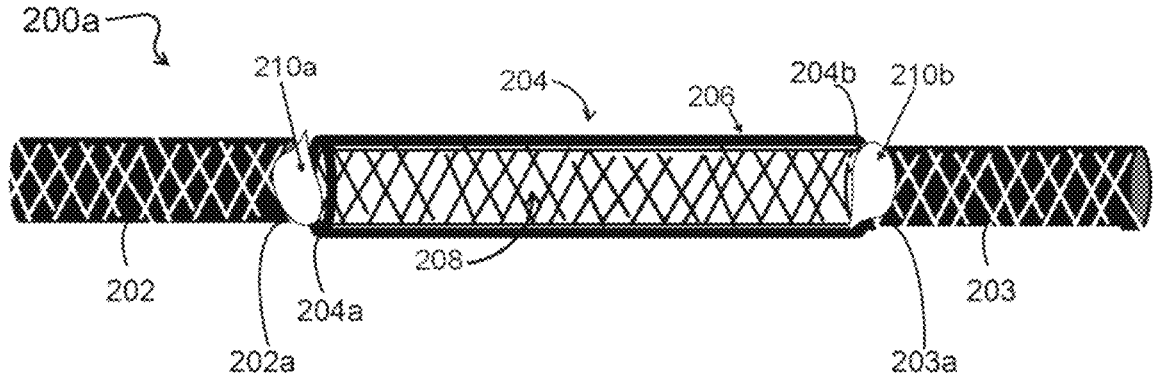
FIG. 2A is an illustration of a portion of a shielded cable assembly at an intermediate stage of fabrication, according to an implementation of an invention.
Figure 2B:
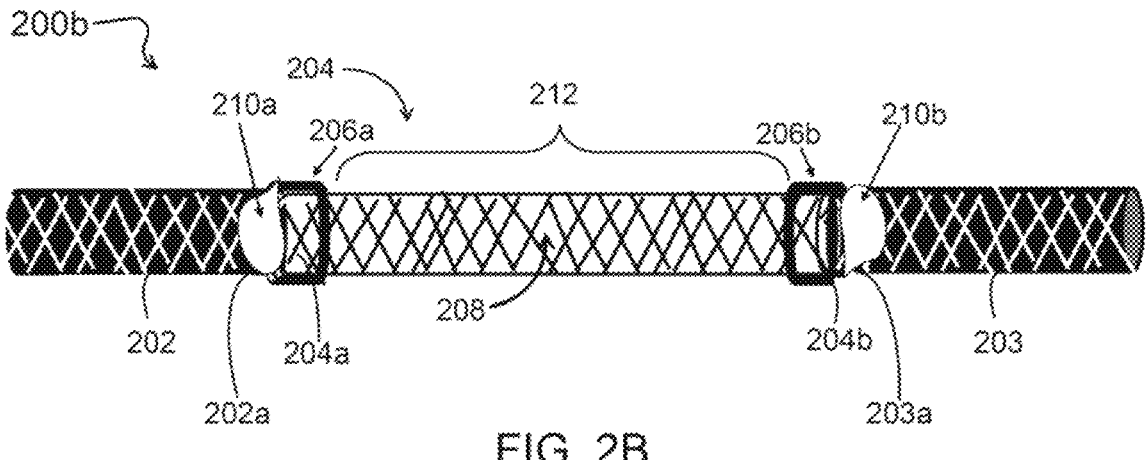
FIG. 2B is an illustration of the portion of the shielded cable assembly of FIG. 2A after fabrication is complete, according to an implementation of the invention.
Figure 2C:
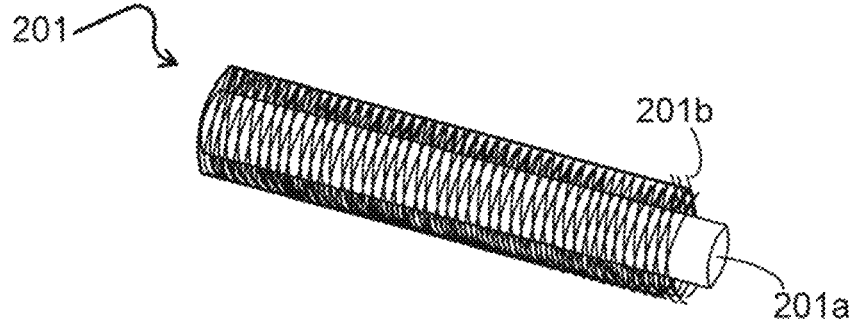
FIG. 2C is a perspective view of a shielded cable.

FIG. 2A is an illustration of portion of a shielded cable assembly after an intermediate stage of its fabrication. FIG. 2B is an illustration of the part of the shielded cable assembly of FIG. 2A after fabrication is complete. FIG. 2C is a perspective view of a shielded cable, such as one of the shielded cables of FIG. 2A or FIG. 2B.

Returning to FIG. 2A, partially fabricated shielded cable assembly 200a includes a first shielding cable (comprising segments 202 and 203) and a second shielding cable 204. Each of segments 202, 203 of first shielding cable 202 and second shielding cable 204 is a cable such as shielded cable 201 of FIG. 2C. Shielded cable 201 comprises a cable core 201a carrying a signal surrounded by a plurality of shielding wires 201b used for shielding cable core 201a. In FIG. 2A, the first shielding cable includes first segment of first shielding cable 202 and second segment of first shielding cable 203, and the shielding wires of each segment of first shielding cable 202, 203 can comprise a same solderable material as one another, and more particularly a solderable metal alloy. Second shielding cable 204 is a length of a cable having shielding wires comprising one or more different materials than material of the shielding wires of first and second segments of first shielding cable 202, 203. The materials forming the shielding wires of second shielding cable 204 can be a material having at least two layers that includes an exterior material 206 and an inner material 208. Exterior material 206 is a solderable material, such as a solderable metal or metal alloy, and provides a solderable interface to electrically connect both first and second segments of first shielding cable 202, 203 to second shielding cable 204. A first end of first segment of first shielding cable 202a is electrically connected to a first end of second shielding cable 204a at a first solder joint 210a, and a first end second segment of first shielding cable 203a is electrically connected to a second end of second shielding cable 204b at a second solder joint 210b. Inner material 208 is a material that acts as a superconductor at and below a critical temperature, $T_C$.

First and second segments of first shielding cable 202, 203 can each be a first shielding cable comprising a solderable material having a low thermal conductivity value. Solderable materials do not require unconventional techniques to interface with standard connectors and components used to couple together any combination of electronic devices, superconducting circuits, and circuit components. The first shielding cables allow for connections to be made between various components of a computing system, such as computing system 100 of FIG. 1, without signal degradation caused by incompatibility of interfacing materials. In an example, the shielding wires of the first shielding cables may comprise CuNi (copper nickel). However, it will be understood that the material of the shielding wires of the first shielding cables is not limited to this example material and may be any material sharing the described desirable properties. In some implementations, first and second segments of first shielding cable 202, 203 can be two portions of a same first shielding cable that has, for instance, been cut into two. In other implementations, each of first segment of first shielding cable 202 and second segment of first shielding cable 203 can be lengths of two different first shielding cables. The first shielding cable(s) can be implemented as a coaxial cable or twisted pair cables. These cabling implementations can provide Faraday shielding around a signal line, reducing RF noise and reducing crosstalk between two or more first shielding cables.

Second shielding cable 204 can also be implemented as a coaxial cable or shielded twisted pair cables. A material having at least two layers can optionally be used to form the shielding wires of second shielding cable 204, such that exterior material 206 can be a thermally conductive, solderable material and inner material 208 can be operable as a superconductor in a particular environment. For example, the shielding wires of second shielding cable 204 can optionally be copper-clad aluminum or silver-coated copper clad aluminum. Exterior material 206 can optionally be the copper, or silver-coated copper, and provides a compatible, solderable interface to the CuNi, which has a low thermal conductivity value, of an example first shielding cable 202. The exterior material 206 can fulfill the Faraday shield requirement and enable a strong electrical connection to be formed between first and second segments of first shielding cable 202, 203 and second shielding cable 204. In one example implementation, inner material 208 can be aluminum or an aluminum alloy. Aluminum acts as a superconductor at and below a critical temperature of 1.1 K. An aluminum alloy, such as aluminum-1% silicon, may have a lower critical temperature and a lower thermal conductivity value than pure aluminum. It will be understood that exterior material 206 and inner material 208 are not limited to the specific materials described herein, and may be alternative materials having similar properties.

One or more partially fabricated shielded cable assemblies, each of which may be partially fabricated shielded cable assembly 200a, can be included as part of an apparatus to be used in a system to transmit signals between at least one classical circuit and a superconducting circuit. Once the apparatus has been assembled, the remainder of the cable assembly fabrication process of partially fabricated shielded cable assemblies 200a can be completed in-situ. Carrying out the remainder of a cable assembly fabrication process described later herein can yield shielded cable assembly 200b of FIG. 2B.

Fabricated shielded cable assembly 200b of FIG. 2B largely corresponds to the structure of partially fabricated shielded cable assembly 200a, although the shielding wires of second shielding cable 204 have been modified to be operable as a thermal break at very low temperatures (i.e., temperatures at which inner material 208 is superconducting). Exterior material 206 does not cover an entire length of second shielded cable 204, and there is instead an exposed portion 212 of inner material 208 of second shielded cable 204.

Exposed portion 212 of inner material 208 is the result of etching a portion of second shielded cable 204. The etching can be performed in-situ on second shielding cable 204 of one or more partially fabricated shielding cable assemblies 200a within an apparatus, as described herein. In-situ etching of the shielding wires of second shielding cable 204 can ensure that all of the shielding wires are etched at a same location along the length of shielded cable assembly 200b. For instance, in an apparatus including more than one shielding cable assembly, interleaving each first shielding cable with second shielding cable 204 while arranged in the apparatus may ensure that the location of the interleaved second shielding cable 204 is the same across all cable assemblies. Subsequently, etching may be performed at the same location across all partially fabricated shielding cable assemblies 200a such that all of the shielded cable assemblies 200b have thermal breaks at the same, desirable location when the apparatus is installed within a system as described herein. The etching of some or all of the partially fabricated shielded cable assemblies 200a may be performed at once, which may beneficially require less time and measurement than may be required to etch each partially fabricated shielding cable assembly 200b individually at corresponding locations.

Exterior material 206 can be removed from second shielding cable 204 through the application of a chemical etchant. For example, a 50% nitric acid solution may be applied to a portion of a copper-clad aluminum cable to remove the copper coating. Resultantly, the shielding cable will have an exposed aluminum portion that can superconduct at and below its $T_C$ value of 1.1 K, or an exposed Al-1% Si portion that can superconduct at and below its $T_C$ value of less than 1.1 K.

In one implementation, exposed portion 212 can optionally extend across a length of second shielding cable 204 that is less than an entire length of second shielding cable 204. There can optionally be segments on one or both of first and second ends of second shielding cable 204a, 204b that still include exterior material 206a, 206b surrounding inner material 208 of each of the shielding wires. In FIG. 2B, it is shown that there are two short lengths of second shielding cable 204 having exterior material 206a and 206b surrounding the shielding wires that abut each of solder joints 210a and 210b. In an alternative implementation (not shown in FIG. 2B), exposed portion 212 may extend across an entire length of second shielding cable 204, spanning a length between first solder joint 210a and second solder joint 210b. Exposed portion 212 does not include solder joints 210a and 210b, and would not interfere with the solderable interface between the shielding wires of first and second segments of first shielding cable 202, 203 and second shielding cable 204.

In an example, the shielding wires of first and second segments of first shielding cable 202, 203 may be comprise CuNi and the shielding wires of second shielding cable 204 may comprise copper-clad aluminum. The copper cladding may be exterior material 206 that has been chemically etched off to reveal exposed portion 212 of aluminum alloy wires, such as aluminum-1% silicon alloy wires, having a $T_C$ of approximately 1.1 K or an aluminum alloy with additional alloying agents, which may have a lower $T_C$. If shielded cable assembly 200b is placed in an environment having a temperature of $T_C$, electrons reduce their interactions with the crystal lattice structure of the aluminum. Subsequently, the decoupling of electrons from the crystal lattice reduces the conduction of thermal energy. At temperatures close to the critical temperature of aluminum, some electrons can still be coupled to the lattice and the thermal conductivity of aluminum can still exceed the thermal conductivity of the CuNi of first and second segments of first shielding cable 202, 203. For a discussion on properties of Al, Al-1% Si, and CuNi, see Ventura et al., *Thermal conductivity of the normal and superconducting Al/Si 1% alloy*, Nuclear Physics B—Proceedings Supplements, Volume 61, Issue 3, 1998, Pages 576-581, ISSN 0920-5632.

At temperatures where aluminum does not superconduct, aluminum has a high thermal conductivity value. Pure aluminum has a thermal conductivity value 100 times larger than an Al-1% Si alloy. Near the critical temperature of aluminum, the thermal conductivity values of both aluminum and the Al-1% Si alloy decrease. As the temperature decreases below the critical temperature of aluminum, fewer electrons remain coupled to the crystal lattice structure and its thermal conductivity value decreases. This becomes materially apparent in the 100 mK to 200 mK temperature range.

Ventura et. al also describes the thermal conductivity of CuNi relative to changes in temperature. CuNi has a lower thermal conductivity than aluminum and the Al-1% Si alloy at temperatures above and near the critical temperature of aluminum. However, the thermal conductivity value of CuNi has a rate of decrease of approximately 10 times per decade of temperature, whereas the thermal conductivity rate of decrease is 65 times per decade for pure aluminum and 100 times per decade for Al-1% Si. At the temperature where the decoupling of electrons from the aluminum crystal structure lattice begins to become materially apparent, approximately 200 mK, the thermal conductivity values of CuNi and Al-1% Si are similar. As temperatures decrease beyond 200 mK, the thermal conductivity value of the Al-1% Si is 10 times lower.

As such, when the shielded cable assembly 200b is placed in an environment having a temperature at or below 200 mK, such as a cryogenic environment as described herein, the thermal conductivity value of exposed portion 212 of inner material 208 is less than the thermal conductivity value of the shielding wires of first shielding cable 202. Beneficially, at least a portion of the thermal energy travelling down the first segment of first shielding cable 202a might inhibit conduction of thermal energy along exposed portion 212 of inner material 208, as exposed portion 212 of inner material acts as a thermal break in shielded cable assembly 200b due to the material properties of inner material 208 at temperatures at or below 200 mK.

Since aluminum is not as strong as CuNi, a larger gauge of copper-clad aluminum cable may be employed to form a desirably durable cable assembly. As the thermal conductivity value of a cable is proportional to its size, an exposed portion 212 of inner material 208 of second shielded cable 204 of a suitably strong gauge may have a thermal conductivity value two to four times lower than the thermal conductivity value of first and second segments of first shielding cable 202, 203 comprising CuNi at temperatures below 200 mK.

Though material properties of shielded cable assembly 200b comprising CuNi and copper-clad aluminum has been described above, these are merely example materials that can optionally be used to form shielded cable assembly 200b. A variety of materials, and alloys of those materials, can be selected such that inner material 208 is superconductive and has a lower thermal conductivity value than a material forming the shielding wires of first and second segments of first shielding cable 202, 203 at a temperature achievable in a cryogenic environment.

As noted above, one or more shielded cable assemblies, such as shielded cable assembly 200b of FIG. 2B, can be included as part of a fully-assembled apparatus. The fully-assembled apparatus can be installed within a system using the shielded cable assemblies to provide a signal path between a computing device and a superconducting circuit that are each located in their respective operating environments.

Figure 3B:
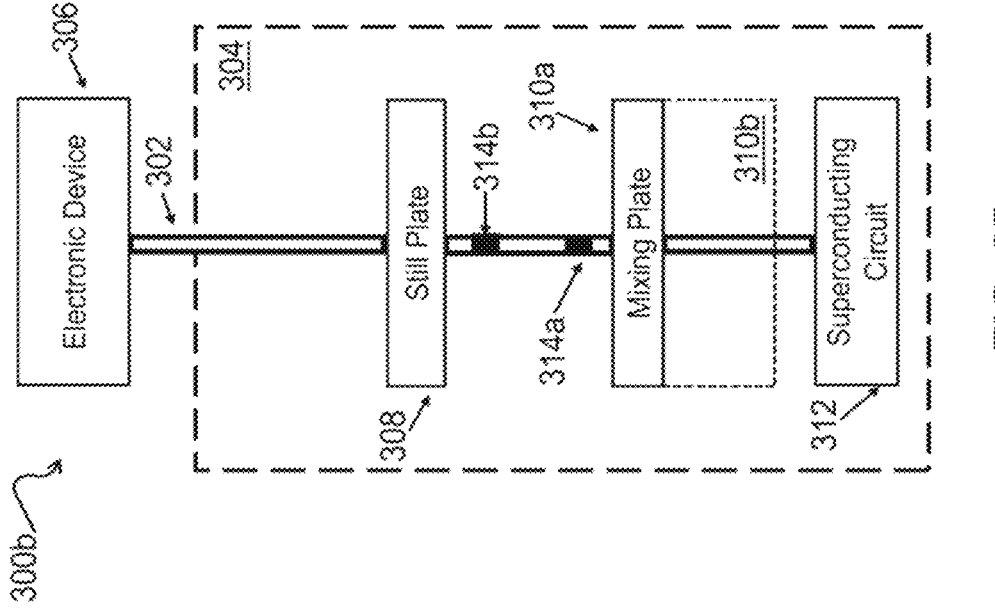
FIG. 3B is a schematic diagram of a second signal path for use in a computing system according to an implementation of the invention.
Figure 3A:
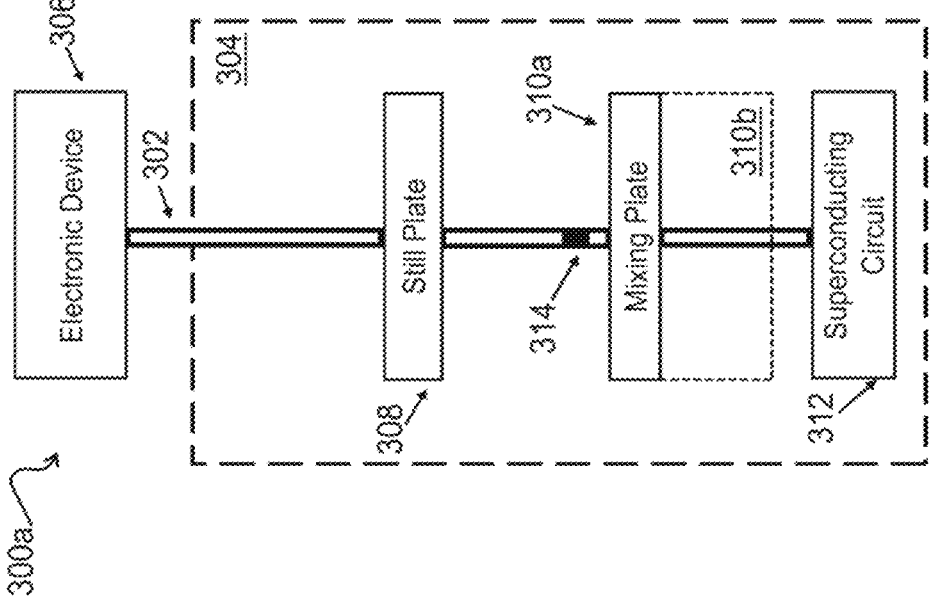
FIG. 3A is a schematic diagram of a signal path for use in a computing system, according to an implementation of the invention.

FIG. 3A is a schematic diagram of a signal path for use in a computing system. FIG. 3A includes system 300a used to transmit electronic signals between an electronic device 306 and a superconducting circuit 312 via a signal path cable assembly 302. Signal path cable assembly 302 terminates at electronic device 306 and travels downwards through cryogenic environment 304 having a plurality of regions with different temperatures. Signal path cable assembly 302 bypasses a still plate 308 and a mixing plate 310a before travelling through a mixing chamber 310b. After exiting mixing chamber 310b, signal path cable assembly 302 terminates at superconducting circuit 312. Within the signal path cable assembly 302, there is a thermal break segment 314 that is operable to reduce a heat load travelling across signal path cable assembly 302 in cryogenic environment 304.

Signal path cable assembly 302 can be implemented as shielded signal cable assembly 200b of FIG. 2B. A majority of a length of signal path cable assembly 302 can comprise a first shielding cable (ex., one of first or second segments of first shielding cable 202, 203), and thermal break segment 314 can be second shielding cable 204 having exposed portion 212. Thermal break segment 314 can comprise shielding wires having only inner material 208, which acts as a superconductor at or below critical temperature, $T_C$.

Electronic device 306 can be any electronic device located outside of cryogenic environment 304 that communicates with superconducting circuit 312. Preferably, electronic device 306 is located in a room-temperature environment. In some implementations, electronic device 306 can optionally be digital computer 102 of hybrid computing system 100 shown in FIG. 1. Electronic device 306 can optionally be a component of digital computer 102, such as digital processor(s) 106 or part of user input/output subsystem 108. Electronic device 306 is not limited to the example implementations described herein, and can be implemented as any suitable electronic device.

Although only one electronic device 306 and signal path cable assembly 302 are shown in FIG. 3A, it will be understood that system 300a is not limited in this manner. Signal path cable assembly 302 may represent a plurality of individual shielded signal cable assemblies, each which may be implemented as shielded cable assembly 200b of FIG. 2B. The plurality of shielded signal cable assemblies may transmit signals between a plurality of electronic devices, represented by electronic device 306, and superconducting circuit 312. One or more shielded signal cable assembly 302 of the plurality of shielded signal cable assemblies may have a dedicated use to transmit signals between superconducting circuit 312 and each electronic device 306.

Signal path cable assembly 302 may interface with electronic device 306 in any suitable manner. In an example, a terminal point of signal path cable assembly 302 may include a coaxial cable connector of any type, and electronic device 306 may have an appropriate input port to receive the coaxial cable connector.

Cryogenic environment 304 is an environment having temperatures within a range of 0 K to about 93 K; however, in practical realizations, a low end of the temperature range is unlikely to reach 0 K. A temperature gradient exists within cryogenic environment 304, such that temperatures get progressively colder toward the bottom of cryogenic environment 304. A region in which superconducting circuit 312 is located has a temperature at a low end of the cryogenic temperature range, such that operation of superconducting circuit 312 may benefit from the advantageous properties of materials at extremely low temperatures. In system 300a, the following components are located within cryogenic environment 304: a majority of signal path cable assembly 302, still plate 308, mixing plate 310a and mixing chamber 301b, and superconducting circuit 312.

Cryogenic environment 304 can optionally be provided by a dilution refrigerator, such as a helium-3-helium-4 dilution refrigerator. In other implementations, other suitable technologies may be used to provide cryogenic environment 304. Examples of technologies used to provide cryogenic environments are described further in: U.S. Pat. No. 9,134,047; U.S. patent application Ser. No. 16/663,723; EP Patent No. 2923160; EP Patent No. 3049736; and, U.S. Pat. No. 10,378,803.

Superconducting circuit 312 is a circuit located in a coldest region of cryogenic environment 304 that receives and transmits signals from electronic device 306 via signal path cable assembly 302. At least a portion of superconducting circuit 312 comprises superconducting materials, and leverages the properties of these materials at low temperatures in its operation. In some implementations, superconducting circuit 312 can optionally be analog computer 104 of FIG. 1. Alternatively, superconducting circuit 312 can optionally be one or more superconducting quantum processors, such as quantum processor 126. Superconducting circuit 312 is not limited to the example implementations described herein, and may be implemented using any suitable superconducting circuit means.

Superconducting circuit 312 can be electrically coupled to signal path cable assembly 302 through any suitable means, such as a zero insertion force (ZIF) connector, a coaxial cable connector, or a soldered interface. At a connecting interface of superconducting circuit 312 and signal path cable assembly 302, signal path cable assembly 302 can be a shielding cable comprising a solderable alloy. For example, at the interface, signal path cable assembly 302 may be first shielding cable 202 of FIG. 2B, and can optionally include shielding wires comprising CuNi.

Still plate 308 is a structure within system 300a inside cryogenic environment 304. Still plate 308 may be a plate at which a still of a dilution refrigerator is located in an implementation where the dilution refrigerator provides cryogenic environment 304. Signal path cable assembly 302 may be arranged to pass through apertures in still plate 308, or to be coupled to a side of still plate 308.

Mixing chamber 310b is a structure within system 300a inside cryogenic environment 304. Mixing chamber 310b can house a mixing chamber portion of a dilution refrigerator for providing cryogenic environment 304, which, for example, may be used for mixing pure $^3$He with $^3$He—$^4$He. Mixing plate 310a can be a structure providing a surface at a top of mixing chamber 310b. Signal path cable assembly 302 can be coupled to mixing plate 310a, and a portion of an apparatus that includes signal path cable assembly 302 can be located inside of mixing chamber 310b.

Thermal break segment 314 is formed within signal cable path assembly 302. Thermal break segment 314 can be a portion of signal cable path assembly 302 where a first shielding cable is interleaved with a second shielding cable comprising an interior and exterior material, and where the second shielding cable has a segment of exposed inner material. In some implementations, the majority of the length of signal path cable assembly 302 may be shielding wires of first and second segments of first shielding cable 202, 203 of FIG. 2B, and thermal break segment 314 may be exposed portion 212 of the shielding wires of second shielding cable 204 comprising inner material 208 that superconducts at and below $T_C$.

Thermal break segment 314 is located between still plate 308 and mixing plate 310a within signal path cable assembly 302. Still plate 308 can be located in a region of cryogenic environment 304 having a temperature of approximately 1 K, and mixing plate 310a can be located in a region of cryogenic environment 304 having a temperature of approximately 15 mK. Consequently, thermal break segment 314 is located in a region having a temperature between 1 k and 15 mK. Signal path cable assembly 302 can be selectively designed such that thermal break segment 314 is located in a region of cryogenic environment 304 that is not only below $T_C$ of inner material 208 of the shielding wires of second shielding cable 204, but in a region where inner material 208 has negligible thermal conductivity. This enables the inner material to act as a thermal isolator, preventing heat in signal path cable assembly 302 from travelling across thermal break segment 314. Subsequently, the heat load carried by signal path cable assembly 302 to superconducting circuit 312 is reduced. This prevents unwanted heat from reaching superconducting circuit 312 that might undesirably impact properties of its superconducting material. Reduction in the heat load can lead to improving the precision and efficiency of operations of superconducting circuit 312.

In some implementations, signal path cable assembly 302 can optionally include two thermal breaks. This is shown in FIG. 3B, which is another schematic diagram of a signal path for use in a computing system. System 300b includes substantially the same components as system 300a of FIG. 3A. However, signal path cable assembly 302 in system 300b includes two thermal break segments 314a and 314b. First thermal break segment 314a is shown in FIG. 3B as corresponding to thermal break 314 in system 300a. Second thermal break segment 314b is an additional thermal break, which is also located between still plate 308 and mixing plate 310a within cryogenic environment 304. Like first thermal break segment 314a, second thermal break segment 314b can also be a length of signal path cable assembly 302 corresponding to exposed portion 212 of shielded cable assembly 200b. In implementations where second thermal break segment 314b is provided by exposed portion 212 of the shielded wires comprising a same inner material 208 as those of first thermal break segment 314a, the location of second thermal break segment 314b might exhibit similar thermally isolating behavior in signal path cable assembly 302 at a proximal location along the signal path.

Signal path cable assembly 302 can optionally include more than two thermal break segments.

As the shielded cable assemblies described herein may be implemented in a non-ideal system, a small quantity of the thermal energy along the signal path cable assembly 302 may conduct along the shielding wires having exposed portion 212 of inner material 208 that behaves as a thermal break. Two or more thermal breaks may be implemented in signal path cable assembly 302 to provide additional opportunities to offload thermal energy before the thermal energy reaches a region of cryogenic environment 304 where superconducting circuit 312 is located.

In implementations where there are two or more thermal breaks, each thermal break segment can optionally be lengths of a same second shielding cable, or two or more different second shielding cables. In implementations where different second shielding cables form two or more thermal breaks, different second shielding cables can optionally include different inner materials that can superconduct at and below different critical temperatures. Thermal breaks formed using different second shielding cables can optionally be located along signal path cable assembly 302 at regions in cryogenic environment 304 in accordance with material properties of the different inner materials.

Signal path cable assembly 302 can be implemented as an apparatus that supports a plurality of shielded cable assemblies. The shielded cable assemblies may be fabricated as a part of assembly of the apparatus, such that the apparatus may initially include lengths of first shielding cable (such as first and second segments of first shielding cable 202, 203), which are then interleaved with lengths of second shielding cable 204 to yield partially fabricated shielding cable assemblies 200a, and lengths of second shielding cable 204 are afterwards etched to yield shielding cable assemblies 200b. The apparatus may take the form of a cabling harness.

Figure 4:
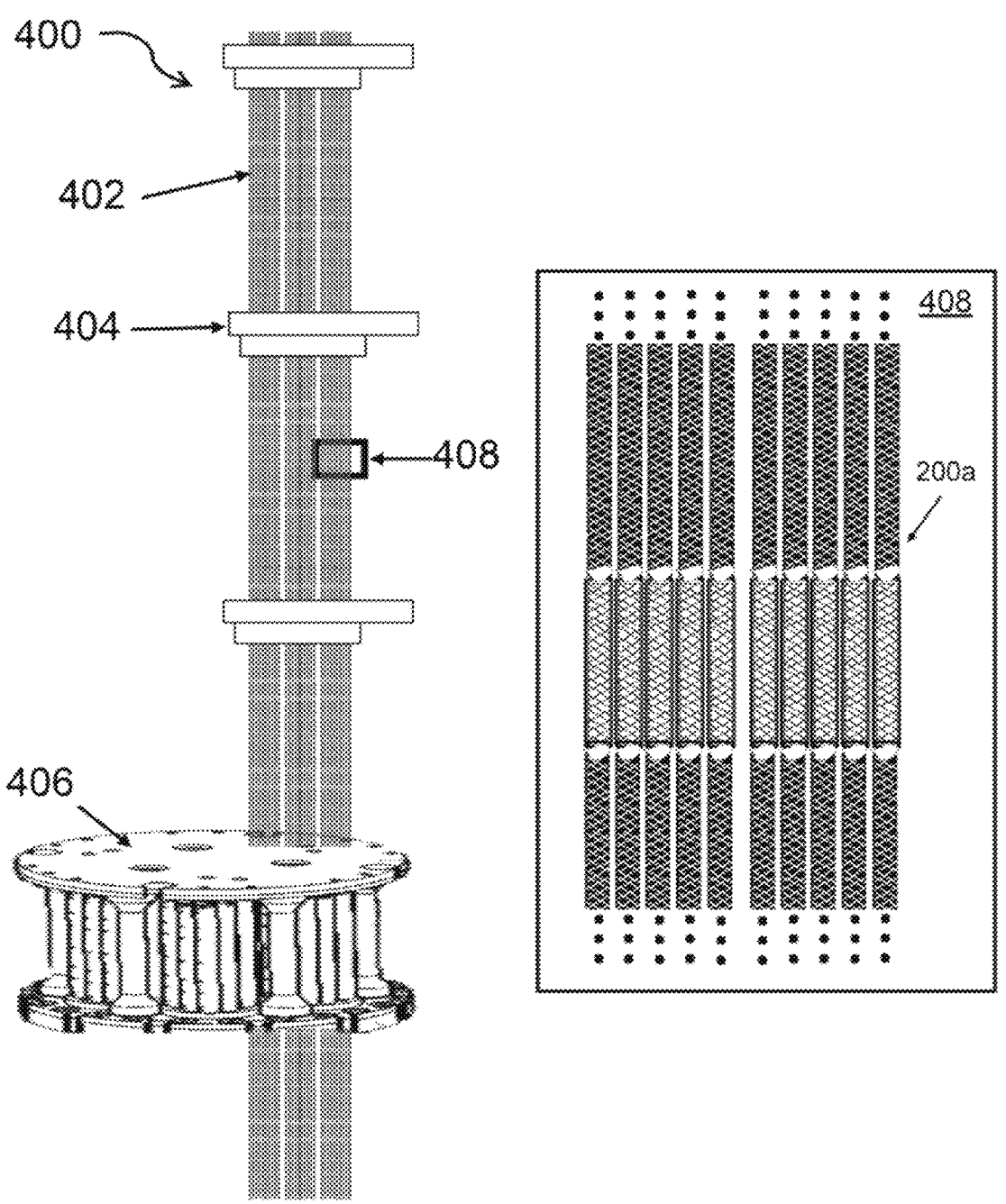
FIG. 4 illustrates a portion of a harness structure during assembly of a system including shielding cable assemblies, according to an implementation of the invention.

FIG. 4 illustrates a portion of a harness structure 400 during assembly of a system including shielding cable assemblies. Harness structure 400 includes one or more bundles 402 (only one called out in FIG. 4) of cable assemblies that can be held in place along their lengths using one or more clips or stays 404. Input/Output (I/O) support structure 406 is located at a distal end of harness structure 400 and coupled to the cable assemblies.

Bundles 402 can include one or more bundles of cabling assemblies, such as the shielded cable assemblies as described herein. Although only three bundles 402 are shown in harness assembly 400 in FIG. 4, any suitable number of bundles 402 may be included. As harness structure 400 is shown at an intermediary stage in its assembly, each of the shielded cable assemblies within bundles 402 might not be fully fabricated. In FIG. 4, each shielded cable assembly within bundles 402 can be partially fabricated shielded cable assembly 200a of FIG. 2A. A first shielding cable may be interleaved with second shielding cable 204 at a connection site 408 within the bundles 402 proximal to I/O structure 406. The enlarged detailed portion in FIG. 4 of connection site 408 shows one of bundles 402 being comprised of a plurality of partially fabricated shielded cable assemblies 200a.

The location of connection site 408 can be selected to correspond to a particular location within a system where harness structure 400 can later be installed. The particular location can be a region having a temperature at or below a temperature where inner material 208 of second shielding cable 204 behaves as a superconductor.

Clips or stays 404 are used to secure one or more bundles 402 of shielded cable assemblies. Although harness structure 400 shows three clips or stays 404, any suitable number of clips or stays 404 may be used. In some implementations clips or stays 404 may include apertures, and bundles 402 of shielded cable assemblies may be passed through, or otherwise physically couple to, these apertures to secure the bundles 402 in place. However, clips or stays 404 are not limited in the described manner and may take any suitable form or structure that does not impede the function of the shielding cable assemblies. Clips or stays 404 may comprise any material that does not introduce any undesirable noise to signals traveling along the shielded cable assemblies.

Although not shown in harness structure 400 of FIG. 4, harness structure 400 can include additional groups of bundles of shielded cable assemblies secured together using corresponding additional sets of clips or stays, running parallel to bundles 402 held by clips or stays 404. These additional groups of bundles can also be passed through, or otherwise physically couple to, I/O structure 406.

I/O support structure 406 is a structure that receives bundles 402 of shielded cable assemblies through a first end of the structure and outputs shielded cable assemblies through a second end of the structure, opposite the first end. I/O support structure 406 may include one or more filters coupled to filter signals transmitted by the shielded cable assemblies, such as a plurality of tubular filter elements. Only a portion of I/O support structure 406 is shown in harness assembly 400 of FIG. 4, and I/O support structure 406 may include additional tiers of tubular filter elements between additional plates. Each shielded cable assembly of bundles 402 may terminate at an input connector of each filter component. A different segment of a shielded cable assembly may be electrically coupled to an output connector of each filter component. At least one of the input connector and the output connector may be selected from the group consisting of: a coaxial cable, a coaxial connector, an ultra-miniature coaxial cable, an ultra-miniature coaxial cable connector, a single conductor wire, a conductive pin, a solder connection, a spring contact, and an SMA connector. The shielded cable assemblies may electrically couple to the input connectors and output connectors through a suitable connecting interface. I/O support structure 406 may be an I/O support structure as described in U.S. Pat. No. 8,279,022.

Harness structure 400 of FIG. 4 illustrates a portion of a harness structure for use in a system involving communication between a computing device and a superconducting circuit. Before installation into the system, the fabrication of each partially fabricated shielded cable assembly 200a is completed by etching a portion of second shielding cable 204 at connection site 408 to yield shielded cable assembly 200b. Resultantly, each shielded cable assembly 200b includes exposed portion 212 of inner material 208 located at connection site 408.

FIG. 5 illustrates a portion of a system 500 including shielding cable assemblies for transmitting signals in a computing system. System 500 can be a system for operating a quantum processor, and coupling the quantum processor to a computing device. System 500 includes harness assembly 502 to couple an electronic device 504 located in an area at a relatively high temperature (e.g., room temperature) to a quantum processor 510 in an area at a relatively low temperature (e.g., cryogenic temperatures, for instance below 15 mK), transmitting signals distally through cryogenic environment 506 across a temperature gradient. System 500 includes plates at regions having different temperatures across the temperature gradient, including, for example: a 4 K plate 516a, a 1 K plate 516b, a 100 mK plate 516c, and a 15 mK plate 516d. Distal to 15 mK plate 516d, there is a chamber 508 through which harness assembly passes before cable assemblies of the harness terminate at quantum processor 510. As well, there is a thermal break site 512 at which the shielded cable assemblies of harness assembly 502 can thermally isolate a portion of the shielded cable assemblies distal to thermal break site 512 from a portion of the shielded cable assemblies proximal to thermal break site 512. It will be understood that other components may be present within system 500 that are not shown in FIG. 5, as will be understood by those of skill in the art.

In some implementations, system 500 may include one or more additional electronic devices in addition to electronic device 504. The electronic devices, including electronic device 504 may take the form of electronic device 306 of system 300a, as described above in relation to FIG. 3A. For instance, the electronic devices may be all or part of digital computer 102 of computing system 100.

In some implementations, cryogenic environment 506 may take the form of cryogenic environment 304 of system 300a, as described above in relation to FIG. 3A. Cryogenic environment 506 can optionally take the form of the described dilution refrigerator in which the temperature decreases across a gradient through cryogenic environment 506.

In some implementations, quantum processor 510 can optionally take the form of quantum processor 126 of computing system 100, as described in relation to FIG. 1. In an alternative embodiment, quantum processor 510 can be any suitable superconducting circuit, such as superconducting circuit 312 of system 300a.

In system 500, quantum processor 510 is located in a region having a coldest temperature within cryogenic environment 504. Quantum processor 510 is housed within shielding structure 514. The shielding cable assemblies of harness structure 502 may also pass through chamber 508 to shielding structure 514 to interface with quantum processor 510.

Harness assembly 502 may take the form of harness assembly 400 of FIG. 4 after it is fully assembled and bundles 402 of shielded cable assemblies have been fully fabricated. Harness assembly 502 is installed within system 500, and may include an I/O support structure, such as I/O support structure 406 that may be housed in chamber 508.

At thermal break site 512, each of the shielded cable assemblies of harness assembly 502 can take the form of shielded cable assembly 200b of FIG. 2B, as shown in the corresponding enlarged detailed portion of FIG. 5. Exterior material 206 has been removed from second shielding cable 204, for example through chemical etching, to provide exposed portion 212 comprising inner material 208. Following removal (e.g., etching), each partially fabricated shielded cable assembly 200a at connection point 408 can take the form of shielded cable assembly 200b shown at thermal break site 512. Inner material 208 acts as a superconductor at the temperature of the location of thermal break site 512.

In some implementations, 1 K plate 516a in cryogenic environment 504 may take the form of still plate 308 of system 300a, as described in relation to FIG. 3A. As well, 15 mK plate 516d in cryogenic environment 504 may take the form of mixing plate 310 of system 300a, and, subsequently, chamber 508 may take the form of mixing chamber 310*b*. Thermal break site 512 is located between 1 K plate 516*b* and 15 mK plate 516*d*; more specifically, thermal break site 512 is located between 100 mK plate 516*c* and 15 mK plate 516*d*.

In an example, second shielding cable 204 can optionally comprise copper-clad aluminum, such that inner material 208 is aluminum. The shielding wires of the first shielding cable (i.e., first and second segments of first shielding cable 202, 203) can optionally comprise CuNi. The temperature at a location between the 100 mK plate and the 15 mK plates of system 500 can optionally be a temperature where a thermal conductivity value of aluminum is less than a thermal conductivity value of the Cu Ni. When quantum processor 510 is cooled in cryogenic environment 506 to a cryogenic temperature, such as 10 mK, the CuNi of the first shielding cable electrically coupled to quantum processor 510 is also cooled. The CuNi shielding wires of the first shielding cable is able to cool the aluminum of exposed portion 212 to a temperature close to 10 mK as well, further reducing the thermal conductivity value of superconducting inner material 208

In this example, heat conduction is substantially reduced or eliminated across the exposed aluminum portion of the shielded cable assemblies at thermal break site 512. The shielded cable assemblies distal to thermal break site 512 that travel through chamber 508 to quantum processor 510 are thermally isolated from the shielded cable assemblies proximal to thermal break site 512 at regions of cryogenic environment 506 having a higher temperature and at regions outside of cryogenic environment 506.

Resultantly, less heat travels throughout cryogenic environment 506 to quantum processor 510. The decreased heat load reduces or maintains the lowest temperature of cryogenic environment 506, as there may be less heat that for example, the dilution refrigerator, must extract, and/or a smaller heat load introduced as a result of signals sent through cables between electronic device 504 and quantum processor 510. A reduced or maintained lowest temperature of cryogenic environment 506 may enable further cooling of the portion of the shielded cable assemblies located within a region at the bottom of the temperature gradient. This may then further cool thermal break site 512 to continue lowering thermal conductivity of inner material 208.

The reduced lowest temperature of cryogenic environment 506 may advantageously lower the temperature of the quantum processor 510. At colder temperatures, there may be less thermal noise interference in the operation of quantum processor 510. Due to the physical properties of superconducting materials, quantum processor 510 may be able to perform more precise calculations at lower temperatures.

Methods of Fabricating and Installing Thermally Isolating Cable Assemblies

Figure 6:
FIG. 6 is a flow chart diagram of an example method to construct a shielded cable assembly for use in a system including transmission of signals in a computing system, according to an implementation of the invention.

FIG. 6 is a flow diagram of an example method 600 of a fabrication process of one or more shielded cable assemblies. The fabrication of each shielded cable assembly can result in shielded cable assembly 200*b*, or a portion of shielded cable assembly 200*b*, shown in FIG. 2B.

Method 600 comprises acts 602 to 604; however, a person skilled in the art will understand that the number of acts illustrated is an example, and, in some implementations, certain acts may be omitted, further acts may be added, and/or the order of the acts may be changed.

At 602, an apparatus is assembled having at least one shielded signal cable assembly. Assembling each shielded signal cable assembly includes electrically connecting a first end of a first shielding cable to a first end of a second shielding cable at a first connection point, as well as electrically connecting a first end of a third shielding cable to a second end of the second shielding cable at a second connection point. The first shielding cable and the third shielding cable include first wires comprising a first solderable material. The second shielding cable includes second wires comprising an inner material surrounded by a second solderable material, and the inner material can be a material that is superconducting at or below a critical temperature.

In an implementation, act 602 can optionally be implemented as method 700 described herein in relation to FIG. 7.

In an implementation, the apparatus being assembled may be harness assembly 400 shown in FIG. 4. Assembling harness assembly 400 may include the partial fabrication of one or more bundles of shielded signal cable assemblies, such as bundles 402 of partially fabricated shielded cable assemblies 200*a*.

In this implementation, the first shielding cable may be a length of a first shielding cable, such as first segment of first shielding cable 202 shown in FIG. 2A, and the third shielding cable may be a different segment of the same first shielding cable, such as second segment of first shielding cable 203. The second shielding cable may be second shielding cable 204 shown in FIG. 2A. The shielding wires of the second shielding cable may include a composite of two or more materials in which the inner material may superconduct at and below a critical temperature and the surrounding material may be solderable to the first solderable material. The inner material of the shielding wires of the second shielding cable may be inner material 208 and the surrounding material may be exterior material 206. Segments of the shielding wires having exterior material 206 at first and second ends of second shielding cable 204*a*, 204*b* may be electrically connected to the shielding wires of the abutting first ends of the first and second segments of first shielding cable 202*a*, 203*a* resulting in the first and second connection points, which may be solder joints 210*a* and 210*b* respectively.

The electrical connection of the first shielding cable and the third shielding cable to the second shielding cable establishes a continuous electrical path through the shielded cable assembly. This enables a signal to travel along the length of the shielded cable assembly uninterrupted. For instance, the shielded cable assembly may be signal path cable assembly 302 of system 300*a* shown in FIG. 3A. Signal path cable assembly 302 forms an electrical signal path between electronic device 306 and superconducting circuit 312. The electrical connection of the first, the second, and the third shielding cables may also establish a continuous thermal path across the shielded cable assembly that allows thermal energy to travel along the length of the cable.

Following the electrical connection of the second shielding cable to the first and the third shielding cables, the remainder of the apparatus assembly may be completed. In an implementation, the partially fabricated bundles of shielded signal cable assemblies may be bundles 402 of harness assembly 400 shown in FIG. 4. Assembling harness assembly 400 may also include attaching bundles 402 to at least clips or stays 404 and I/O support structure 406. The assembling of harness assembly 400 may be performed in a room temperature environment. The fully assembled harness assembly 400 may be independent of components of a refrigeration unit.

In another implementation, the apparatus being assembled might not be limited to harness assembly 400 or 502 and may be an alternative structure. The alternative structure may include one or more partially fabricated shielded signal cable assemblies, which may be partially fabricated shielded cable 200*a*.

In some implementations, the first shielding cable and the third shielding cable can be two portions of a same initial first shielding cable. For instance, a shielding cable comprising a solderable alloy can be cut in two to yield first segment of first shielding cable 202 and second segment of first shielding cable 203, as described later with respect to act 702 of method 700.

In other implementations, the first shielding cable and the third shielding cable can be two solderable shielding cables that have been separately manufactured. The first shielding cable and the third shielding cable can be two lengths of a same shielding material, i.e., formed of a same solderable material. Alternatively, the first shielding cable and the second shielding cable can be cables formed of different solderable materials.

At 604, subsequent to assembling the apparatus, a portion of the wires of the second shielding cable of each shielded signal cable assembly is etched to remove the second solderable material and to expose the inner material.

In an implementation, the assembled apparatus may take the form of harness assembly 400 shown in FIG. 4. After act 602 of method 600, each of the bundles 402 in harness structure 400 may include one or more partially fabricated shielded cable assemblies 200*a* as seen in the enlarged detailed portion showing connection site 408. The portion of the shielding wires of the second shielding cable that is etched at act 604 may take the form of exposed portion 212 of the shielding wires of second shielding cable 204, as shown previously in FIG. 2B. The etching of each shielding cable assembly at act 604 may produce shielding cable assembly 200*b*. The etching may include removing exterior material 206 from shielding wires along a length of second shielding cable 204 corresponding to a length of exposed portion 212 of inner material 208.

In an implementation, one or more partially fabricated shielding cable assemblies, each of which can take the form of partially fabricated shielding cable assembly 200*a*, may be etched at once (e.g., concurrently or even simultaneously). One or more bundles 402 of partially fabricated shielding cable assemblies may be etched at once (e.g., concurrently or even simultaneously). For example, completion of act 604 may produce harness assembly 502 having bundles of fully fabricated shielding cable assemblies, each of which may be implemented, for example, as shielding cable assembly 200*b* once the shielding cable assemblies are fully fabricated.

In an alternative implementation, the assembled apparatus might not take the form of harness assembly 400 but instead take the form of an alternative structure. One or more partially fabricated shielding cable assemblies and/or bundles of partially fabricated shielding cable assemblies arranged as part of the alternative structure may be etched at once (e.g., concurrently or even simultaneously).

The etching of the shielded wires of the second shielding cable can create a break in the continuous thermal path formed by electrically connecting the first, the second, and the third shielding wires. The thermal conductivity value of the exposed inner material portion of the second shielding cable wires is low enough to lower the amount of thermal energy travelling across the thermal path. This functions as a thermal break, such as thermal break segment 314 of system 300 in FIG. 3A that reduces a heat load carried to superconducting circuit 312. Although the thermal path can be interrupted by the etched portion of the second shielding cable, the electrical path across the shielded cable assembly remains intact.

Performing the etching of the shielded wires of the second shielding cable following the assembly of the apparatus may be advantageous in the consistent fabrication of shielding cable assemblies. Interleaving the second shielding cable between the first and the third shielding cables while coupled to the apparatus may ensure that the second shielding cables of a plurality of shielding cable assemblies are all co-located along the shielded cable assembly. Etching following assembly of the apparatus allows each of the second shielding cables to be connected with respective first and third shielding cables, since the exterior material of the shielding wires serves as a solderable interface. Etching following the assembly of the apparatus also enables some or all the shielded cable assemblies to be etched at once. This ensures that the etched locations of the shielded cable assemblies are aligned with one another, and requires less time and etchant. Performing act 604 of method 600 following the assembly of the apparatus at 602 may beneficially provide a fabrication process of thermally isolating cable assemblies that is more resource efficient and precise than other processes known in the art.

FIG. 7 is a flow diagram of an example method 700 to assemble an apparatus, such as to assemble the apparatus in act 602 of method 600 shown in FIG. 6.

Method 700 comprises acts 702 to 712; however, a person skilled in the art will understand that the number of acts illustrated is an example, and, in some implementations, certain acts may be omitted, further acts may be added, and/or the order of the acts may be changed.

At 702, an initial shielding cable is cut at a transitional location to produce the first and the third shielding cables. In an embodiment, the initial shielding cable may take the form of a first shielding cable having shielding wires comprising a solderable metal alloy with a low thermal conductivity value, such as CuNi. One or more initial shielding cables may be arranged in bundles within an apparatus. For example, prior to the completion of act 602 of method 600, bundles 402 arranged in harness structure 400 of FIG. 4 may include cables formed entirely from first shielding cables. At act 702, harness assembly 400, or an alternative structure as described above, may otherwise be partially assembled. For instance, bundles 402 might not yet be attached to I/O structure 406.

In an implementation, the transitional location may be a location that, when harness assembly 400 is installed at least partially within a cryogenic environment, has a temperature where the thermal conductivity value of the exposed inner material of the shielding wires of the second shielding cable is lower than the thermal conductivity value of the first solderable material of the shielding wires of the first shielding cable. For example, the transitional location may take the form of connection site 408 within bundles 402. Following fabrication of the shielding signal cable assembly and assembly of harness assembly 400, harness assembly 502 may be installed in system 500 as shown in FIG. 5. Once installed, connection site 408 may be arranged as thermal break site 512, which is located between 1 K plate 516*b* and 15 mK plate 516*d*. In an implementation where inner material 208 of the shielding wires of second shielding cable 204 is aluminum, the location of thermal break site 512 is a location where the thermal conductivity value of aluminum is less than the thermal conductivity value of CuNi (i.e., at a location having a temperature less than 200 mK).

The cutting can be performed using any suitable tools and methods, such as through the use of wire cutters or other suitable tools. Cutting the initial shielding cable may result in two segments of shielding cables; for instance, cutting an initial first shielding cable can yield first segment of first shielding cable 202 and second segment of first shielding cable 203 as the first shielding cable and the third shielding cable, respectively.

At 704, shielding wires of the first and the third shielding cables are separated to create a gap. As described above, the first and third shielding cables may be a coaxial cable or a twisted pair of wires comprising a solderable alloy having a low conductivity value. The shielded wires may be separated from one another using any suitable tools or methods, such as a tweezers, pliers or a dedicated tool. In some embodiments, the gap may be approximately 10 cm in length.

At 706, a second shielding cable is inserted into the gap. The second shielding cable may be second shielding cable 204 of FIG. 2A, and may include shielding wires comprising copper-clad aluminum. The second shielding cable has a same length as the gap. In some implementations, at least some of the first and the third shielding cables and the second shielding cable may be held in place using a clamp, stay, or another holding apparatus.

At 708, the second shielding cable is soldered to the first and the third shielding cables. The first end of the second shielding cable may be soldered to the first end of the first shielding cable at the first connection point, and the second end of the second shielding cable may be soldered to the first end of the third shielding cable at the second connection point.

In an example, the first and second ends of the second shielding cable may take the form first and second ends of second shielding cable 204a, 204b of FIG. 2A. The first and second segments of first shielding cable 202, 203 of FIG. 2A may take the form of the first and the third shielding cables, respectively. First end of second shielding cable 204a may be soldered to the abutting first end of first segment of first shielding cable 202a, forming solder joint 210a. Second end of second shielding cable 204b may be soldered to the abutting first end of second segment of first shielding cable 203a, forming solder joint 210b. Solder joints 210a and 210b may be the first and second connection points, respectively.

Optionally, at 710, the excess material from the first and third shielding cables is trimmed. Following the soldering of the first and second ends of the second shielding cable to the first ends of the first and the third shielding cables at act 708 respectively, there may be some remaining separated wires comprised of the first solderable material from the first and the third shielding cables outside of solder joints 210a and 210b. These remaining separated wires may be trimmed using any suitable wire cutting apparatus, such as a wire cutter or a different tool.

In an implementation, the entire first shielding cable may be cut, including cable core (ex., cable core 201a). Alternatively, only the shielding wires (ex., shielding wires 201b) of first shielding cable may be cut and the cable core may remain intact. In such an implementation, the shielding wires of the first shielding cable may be separated to form the gap, and a length of shielding wires comprising at least two layers (i.e., exterior material 206 and inner material 208) may be inserted around the cable core in the gap. The shielding layers comprising at least two layers may be soldered to the shielding wires of first and second segments of first shielding cable 202, 203.

At 712, the assembly of the apparatus is completed. Once act 710 is complete, the shielded signal cable assemblies are partially fabricated, and for example, each may take the form of partially fabricated shielded cable 200a. Assembly of the apparatus including the shielded signal cable assemblies may then proceed.

In an example, after act 712 the apparatus may take the form of harness assembly 400 of FIG. 4. Here, harness assembly includes bundles 402 of the partially fabricated signal cable assemblies organized using clips or stays 404. Bundles 402 feed into I/O structure 406, which also optionally includes filters (e.g., tubular filter elements). In some implementations, the completion of assembling the apparatus may include feeding the shielding cables having wires comprising the first solderable material of the shielded signal cable assemblies into I/O structure 406. In some implementations, assembling the apparatus may include electrically connecting a terminal point of the shielding cables comprising the first solderable material to input interfaces of the tubular filters and/or electrically connecting a terminal point of a different set of shielding cables having wires comprising the first solderable material to output interfaces of the tubular filters.

Figure 8:
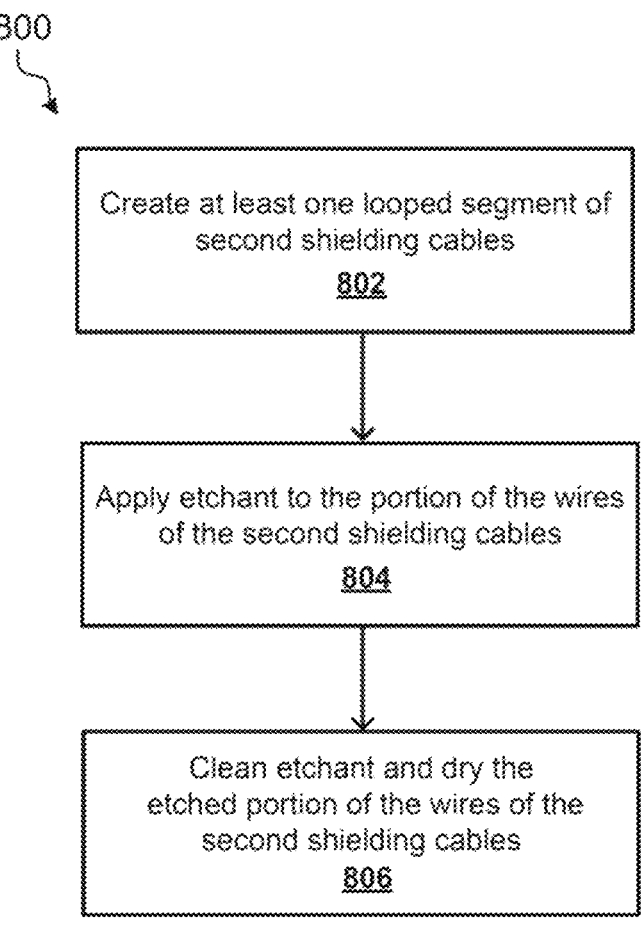
FIG. 8 is a flow chart diagram of an example method to perform etching as part of the construction of the shielded cable assembly of FIG. 6, according to an implementation of the invention.

FIG. 8 is a flow diagram of an example method 800 to etch a portion of the of the second shielding cable of each shielded signal cable assembly, such as the etching in act 604 of method 600 of FIG. 6. The acts of method 800 can optionally be performed after the acts of method 700 of FIG. 7 in which the apparatus is assembled.

Method 800 comprises acts 802 to 806; however, a person skilled in the art will understand that the number of acts illustrated is an example, and, in some implementations, certain acts may be omitted, further acts may be added, and/or the order of the acts may be changed.

At 802, at least one looped segment of second shielding cables is created. In an example, each of the second shielding cables may be second shielding cable 204, which is part of partially fabricated shielded cable assembly 200a of FIG. 2A. Partially fabricated shielded cable assemblies 200a may be arranged in bundles 402 within harness assembly 400 of FIG. 4. At least one loop may be formed in bundles 402 at connection point 408 where the second shielding cables 204 are located within the partially fabricated shielded signal cable assemblies 200a.

In an implementation, a single loop may be formed using all the partially fabricated shielded signal cable assemblies in a bundle. Alternatively, a single loop may be formed using all or some of the partially fabricated shielded signal cable assemblies belonging to more than one bundle. As another alternative, a loop may be formed from only one or some of the partially fabricated shielded signal cable assemblies belonging to a bundle.

At 804, etchant is applied to a portion of the second shielding cables. An etchant may be applied to the at least one loop formed of second shielding cables of partially fabricated shielded cable assemblies. In one implementation, the looped segments may be dipped into the etchant. Alternatively, the etchant may be applied in any other suitable manner, such as painting, spraying or otherwise depositing the etchant onto the looped segments. The etchant removes the second solderable material from the shielding wires of the second shielding cables. The etching can be performed with or without application of mechanical force.

The etchant may be a chemical etchant. In some embodiments, the etchant may be a nitric acid solution, such as a 50% nitric acid solution having a temperature of 50° C. However, the etchant used is not limited to a 50% nitric acid solution and may instead be any chemical etchant having a suitable chemical composition, strength, and temperature to effectively remove the second solderable material from the second shielding wire without damaging the inner material.

The connection points and the first shielding wires are not exposed to the chemical etchant and are preferably not included as part of the looped segments. In some implementations, a masking material may be placed over the connection points and the first and the third shielding wires to prevent exposure to the etchant. The masking material may be removed subsequent to the etching.

In an embodiment, each of the partially fabricated shielded signal cable assemblies being etched are partially fabricated shielded cable assembly 200*a*. The etchant may be applied to a looped segment, or portion thereof, that includes second shielding cable 204 and may remove exterior material 206 from the shielding wires, leaving only inner material 208. Solder joints 210*a* and 210*b* and first and second segments of first shielding cable 202, 203 might not be exposed to the etchant. For example, shielding wires of a second shielding cable may comprise copper-clad aluminum. A 50% nitric acid solution may be applied to a portion of second shielding cable 204 and may etch away the copper exterior of the shielding wires, exposing the aluminum underneath. The completion of act 804 may yield shielded signal cable assembly 200*b* of FIG. 2B. Fabricated shielded cable assembly 200*b* has exposed portion 212 of inner material 208.

At 806, the etchant is cleaned or otherwise removed from the second shielding cables, and the etched portion of the second shielding cables are dried. For example, the etchant may be cleaned using distilled water or another suitable substance. Drying the etched portions may be performed using any suitable methods such as, for example, air drying.

In some implementations, the etching can optionally be performed in an alternative manner. The etching can optionally include mechanical abrasion of exterior material 206 of the shielding wires of second shielding cable 204. For example, this may be performed using one of: sandpaper, sand blasting, or blasting with other media such as sodium bicarbonate. Alternatively, mechanical abrasion may be performed in a fluidized bed. Alternatively, mechanical abrasion may be performed using a slurry of abrasive particulate, such as used in chemical-mechanical planarization. In another example, the etching can optionally include laser ablation using a laser that selectively ablates exterior material 206 and not inner material 208 of the shielding wires of second shielding cable 204. In a further example, the etching can optionally be performed using plasma etching. For example, plasma etching may be performed using argon or other ions, or through reactive plasma etching. In both examples, the connection points and the first and the third shielding cables require protection from the etch plasma.

Following method 800, some or all the shielded signal cable assemblies with the apparatus may be etched. In an embodiment, some or all of the cables in bundles 402 of harness assembly 400 may be etched and thus fully fabricated. Consequently, at connection point 408, each of the cables may take the form of shielded signal cable assembly 200*b* instead of 200*a* shown in FIG. 4. The apparatus including fully fabricated shielded signal cable assemblies may then be installed in a system for use. In an embodiment, harness assembly 502 may include fully fabricated shielded cable assemblies 200*b* and may be installed in system 500, as shown in FIG. 5, and at least part of harness assembly 400 may be in cryogenic environment 506.

Use of the thermally isolating shielded cable assemblies as described herein may improve the operating conditions of a superconducting circuit. As superconducting circuits comprise superconducting materials, their desired properties may be best realized at extremely low temperatures. Superconducting circuits may be located at a coldest region of a cryogenic environment in order to provide these extremely low temperatures. However, superconducting circuits may be required to communicate with a classical computing device that might be located outside the cryogenic environment, and a cable assembly used to transmit signals between the devices may carry thermal energy through the cryogenic environment to the superconducting circuit. This may undesirably raise the temperature of the superconducting circuit and may introduce error to its operation.

The described thermally isolating shielded cable assembly provides a cable assembly that may reduce an amount of thermal energy transmitted to the superconducting circuit. The described cable assembly easily interfaces with both the computing device and the superconducting circuit, and includes a strategically located thermal break site that may limit the transmission of undesired thermal energy. The thermal break site leverages material properties of superconducting materials in the cryogenic environment to produce a segment of the cable assembly having a thermal conductivity lower than that of the easily-interfaceable cable, preventing heat from travelling.

The described thermally isolating shielded cable assembly provides a cabling structure operable to transmit a signal across a computing system, in which one of the components at a terminating end of the assembly may be sensitive to thermal energy and may be preferably located in a cryogenic environment. The cabling structure described herein can provide a continuous electrical path along the entire length of the shielded cable assembly, and a non-continuous thermal path along the shielded cable assembly. An interruption in the thermal path can be provided by interleaving a first shielded cable assembly with a second shielded cable assembly, in which wires of the second shielded cable assembly can be etched to provide a portion of an exposed superconducting material that is not thermally conductive below a known cryogenic temperature.

The above described method(s), process(es), or technique(s) could be implemented by a series of processor readable instructions stored on one or more nontransitory processor-readable media. Some examples of the above described method(s), process(es), or technique(s) method are performed in part by a specialized device such as an adiabatic quantum computer or a quantum annealer or a system to program or otherwise control operation of an adiabatic quantum computer or a quantum annealer, for instance a computer that includes at least one digital processor. The above described method(s), process(es), or technique(s) may include various acts, though those of skill in the art will appreciate that in alternative examples certain acts may be omitted and/or additional acts may be added. Those of skill in the art will appreciate that the illustrated order of the acts is shown for example purposes only and may change in alternative examples. Some of the example acts or operations of the above described method(s), process(es), or technique(s) are performed iteratively. Some acts of the above described method(s), process(es), or technique(s) can be performed during each iteration, after a plurality of iterations, or at the end of all the iterations.

The above description of illustrated implementations, including what is described in the Abstract, is not intended to be exhaustive or to limit the implementations to the precise forms disclosed. Although specific implementations of and examples are described herein for illustrative purposes, various equivalent modifications can be made without departing from the spirit and scope of the disclosure, as will be recognized by those skilled in the relevant art. The teachings provided herein of the various implementations can be applied to other methods of quantum computation, not necessarily the example methods for quantum computation generally described above.

The various implementations described above can be combined to provide further implementations. All of the commonly assigned US patent application publications, US patent applications, foreign patents, and foreign patent applications referred to in this specification and/or listed in the Application Data Sheet are incorporated herein by reference, in their entirety, including but not limited to: U.S. Pat. Nos. 7,533,068; 8,008,942; 8,195,596; 8,190,548; 8,421,053; 9,134,047; 10,378,803; and, 8,279,022; U.S. patent application Ser. No. 16/663,723; EP Patents No. 2923160; and 3049736; and U.S. Provisional Patent Application No. 63/317,192.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

What is claimed is:

1. A shielded signal cable assembly comprising:
a first shielding cable having first shielding cable wires comprising a first solderable material;
a second shielding cable having second shielding cable wires comprising an inner material and a second solderable material that surrounds the inner material, wherein the inner material is a material that is superconducting at and below a critical temperature; and
a first solder joint via which a first end of the first shielding cable and a first end of the second shielding cable are electrically connected,
wherein a length of the second shielding cable has an exposed inner material portion at which the second solderable material of the second shielding cable wires has been etched.

2. The shielded signal cable assembly of claim 1, wherein a thermal conductivity value of the exposed inner material portion of the second shielding cable wires is lower than a thermal conductivity value of the first solderable material of the first shielding cable wires in a range of temperatures.

3. The shielded signal cable assembly of claim 2, wherein the exposed inner material portion of the second shielding cable wires is operable as a heat switch at a temperature within the range of temperatures.

4. The shielded signal cable assembly of claim 1, further comprising a second solder joint via which a second end of the second shielding cable and a first end of a third shielding cable are electrically connected, wherein the third shielding cable has third shielding cable wires formed of the first solderable material.

5. The shielded signal cable assembly of claim 4, further comprising:
one or more additional second shielding cables, each having a respective additional exposed inner material portion at which the second solderable material of a respective additional second shielding cable wire has been etched;
one or more third shielding cables;
one or more respective first shielding cables;
one or more respective first solder joints via which each of a first end of a respective one of the one or more additional second shielding cables and a first end of a respective first shielding cable are electrically connected; and
one or more respective second solder joints, via which each of a second end of a respective one of the one or more additional second shielding cables and a first end of a respective third shielding cable are electrically connected.

6. The shielded signal cable assembly of claim 4, wherein the exposed inner material portion is located medially along the second shielding cable to each of the first solder joint and the second solder joint.

7. The shielded signal cable assembly of claim 1, wherein the second solderable material of the second shielding cable is copper or silver-coated copper, the inner material is aluminum, and wherein the critical temperature is 1.1K.

8. The shielded signal cable assembly of claim 1, wherein the first solderable material and the second solderable material are different materials.

9. The shielded signal cable assembly of claim 1, wherein the first shielding cable comprises a first cable core surrounded by the first shielding wires and the second shielding cable comprises a second cable core surrounded by the second shielding wires,
wherein the first shielding wires and the second shielding wires respectively shield the first cable core and the second cable from electromagnetic interference (EMI) and radio frequency interference (RFI),
wherein the first shielding cable and the second shielding cable are each one of a coaxial cable or a twisted pair.

\* \* \* \* \*